United States Patent
Balakrishnan et al.

(10) Patent No.: US 8,976,561 B2
(45) Date of Patent: Mar. 10, 2015

(54) SWITCH MODE POWER CONVERTERS USING MAGNETICALLY COUPLED GALVANICALLY ISOLATED LEAD FRAME COMMUNICATION

(71) Applicant: Power Integrations, Inc., San Jose, CA (US)

(72) Inventors: Balu Balakrishnan, Saratoga, CA (US); David Michael Hugh Matthews, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 211 days.

(21) Appl. No.: 13/677,120

(22) Filed: Nov. 14, 2012

(65) Prior Publication Data

US 2014/0133186 A1    May 15, 2014

(51) Int. Cl.
*H02M 1/00* (2006.01)
*H01L 23/495* (2006.01)
(Continued)

(52) U.S. Cl.
CPC .... *H01L 23/49575* (2013.01); *H01L 23/49541* (2013.01); *H02M 3/00* (2013.01); *H01L 23/495* (2013.01); *H01L 23/66* (2013.01); *H01L 2224/48247* (2013.01); *H01L 2224/48257* (2013.01); *H01L 2224/4911* (2013.01); *H01L 2224/49111* (2013.01); *H01L 2924/19107* (2013.01); *H01L 2924/30107* (2013.01)
USPC ........................................................ 363/147

(58) Field of Classification Search
USPC ........ 363/17, 20, 21.1, 95, 97, 147; 455/41.1, 455/63.1, 73, 128, 296, 333; 257/666, 676, 257/678, 687, 690, 787
See application file for complete search history.

(56) References Cited

U.S. PATENT DOCUMENTS

| 5,162,970 | A | 11/1992 | Davis, Jr. et al. |
| 5,469,334 | A | 11/1995 | Balakrishnan |

(Continued)

FOREIGN PATENT DOCUMENTS

| EP | 2 461 335 A1 | 6/2012 |
| JP | H 09-260569 | 10/1997 |

OTHER PUBLICATIONS

U.S. Appl. No. 13/677,068—Non-Final Office Action, mailed Dec. 27, 2013 (11 pages).

(Continued)

*Primary Examiner* — Adolf Berhane
(74) *Attorney, Agent, or Firm* — Blakely Sokoloff Taylor & Zafman LLP

(57) ABSTRACT

An integrated circuit package for use in a switch mode power converter comprises an encapsulation and a lead frame. A portion of the lead frame is disposed within the encapsulation. The lead frame includes a first conductor having a first conductive loop disposed substantially within the encapsulation. The lead frame also includes a second conductor galvanically isolated from the first conductor. The second conductor includes a second conductive loop disposed substantially within the encapsulation proximate to and magnetically coupled to the first conductive loop to provide a communication link between the first and second conductors. A first control die including a first control circuit is coupled to the first conductor. A second control die including a second control circuit is coupled to the second conductor. One or more control signals are communicated between the first and second control dice through the communication link.

32 Claims, 12 Drawing Sheets

(51) Int. Cl.
*H02M 3/00* (2006.01)
*H01L 23/66* (2006.01)

(56) References Cited

U.S. PATENT DOCUMENTS

| | | | |
|---|---|---|---|
| 5,650,357 | A | 7/1997 | Dobkin et al. |
| 6,285,084 | B1* | 9/2001 | Hikita et al. .................. 257/777 |
| 6,384,478 | B1 | 5/2002 | Pour |
| 6,509,807 | B1* | 1/2003 | Anthony et al. ................ 333/12 |
| 6,518,885 | B1 | 2/2003 | Brady et al. |
| 6,930,584 | B2 | 8/2005 | Edo et al. |
| 6,970,367 | B2* | 11/2005 | Takeshima et al. ........... 363/147 |
| 6,982,621 | B2 | 1/2006 | Park |
| 6,998,952 | B2 | 2/2006 | Zhou et al. |
| 7,046,114 | B2 | 5/2006 | Sakata |
| 7,091,791 | B1 | 8/2006 | Terrovitis |
| 7,202,790 | B2* | 4/2007 | Copeland et al. .......... 340/572.7 |
| 7,276,897 | B2 | 10/2007 | Lee |
| 7,280,024 | B2 | 10/2007 | Braunisch |
| 7,419,838 | B2 | 9/2008 | Power et al. |
| 7,447,492 | B2* | 11/2008 | Dupuis ......................... 455/333 |
| 7,468,547 | B2 | 12/2008 | Harvey |
| 7,524,731 | B2 | 4/2009 | Wang |
| 7,577,223 | B2 | 8/2009 | Alfano et al. |
| 7,619,297 | B2 | 11/2009 | Wang |
| 7,868,431 | B2 | 1/2011 | Feng et al. |
| 7,884,696 | B2 | 2/2011 | Hébert et al. |
| 8,093,983 | B2 | 1/2012 | Fouquet et al. |
| 8,412,006 | B2 | 4/2013 | Tay et al. |
| 8,772,909 | B1 | 7/2014 | Vinciarelli |
| 8,818,296 | B2 | 8/2014 | Kung et al. |
| 2004/0214376 | A1 | 10/2004 | Gibson et al. |
| 2005/0271148 | A1 | 12/2005 | Dupuis |
| 2007/0276270 | A1* | 11/2007 | Tran ............................. 600/508 |
| 2009/0102543 | A1* | 4/2009 | Xiong ........................... 327/530 |
| 2010/0270382 | A1 | 10/2010 | Koepp et al. |
| 2011/0121934 | A1* | 5/2011 | Hebert et al. ................. 336/200 |
| 2011/0254123 | A1* | 10/2011 | Sellathamby et al. ........ 257/531 |
| 2012/0307932 | A1* | 12/2012 | McCormack et al. ........ 375/295 |
| 2013/0024059 | A1* | 1/2013 | Miller et al. .................... 701/22 |
| 2013/0140370 | A1 | 6/2013 | Finn |
| 2014/0131843 | A1* | 5/2014 | Balakrishnan et al. ....... 257/666 |
| 2014/0204623 | A1* | 7/2014 | Djenguerian et al. ..... 363/21.12 |

OTHER PUBLICATIONS

Krakauer, David, "Digital Isolation Rivals Optocouplers in Terms of Power, Size and Performance," New Electronics, Oct. 25, 2011 (4 pages) http://www.newelectronics.co.uk/electronics-technology/digital-isolation-rivals-optocouplersin-terms-of-power-size-and-performance/37721/.

"ACSL-6xx0: Multi Channel and Bi-Directional 15 MBd Digital Logic Gate Optocoupler," Avago Technologies, Feb. 5, 2009 (19 pages).

"ACPL-W611/ACPL-P611: High CMR, High Speed TTL Compatible Optocoupler," Avago Technologies, Jun. 15, 2006 (10 pages).

"LT5527: 400MHz to 3.7GHz 5V High Signal Level Downconverting Mixer," Linear Technology Corporation, 2005, Version LT 1108 Rev. A (16 pages).

"LTM2881: Complete Isolated RS485/RS422 µModule Transceiver + Power," Linear Technology Corporation, 2009, Version LT 0412 Rev. E (24 pages).

Lu et al., "Research Article: On-Chip Bondwire Magnetics with Ferrite-Epoxy Glob Coating for Power Systems on Chip," International Journal of Power Management Electronics, 2008, vol. 2008, Article ID 678415 (9 pages).

Münzer et al., "Coreless Transformer a New Technology for Half Bridge Driver IC's," Infineon Technologies, No Date (4 pages).

Münzer et al., "Insulated Signal Transfer in a Half Bridge Driver IC Based on Coreless Transformer Technology," The Fifth International Conference on Power Electronics and Drive Systems Nov. 17-20, 2003, 2003, 1:93-96.

"NCP4302: Secondary Side Synchronous Flyback Controller," Semiconductor Components Industries, LLC, Jul. 2010, Rev. 3 (16 pages).

Wu et al., "High-Efficiency Silicon-Embedded Coreless Coupled Inductors for Power Supply on Chip Applications," IEEE Transactions on Power Electronics, Nov. 2012, 27(11):4781-4787.

U.S. Appl. No. 13/677,088—Non-Final Office Action, mailed Aug. 22, 2014, 9 pages.

* cited by examiner

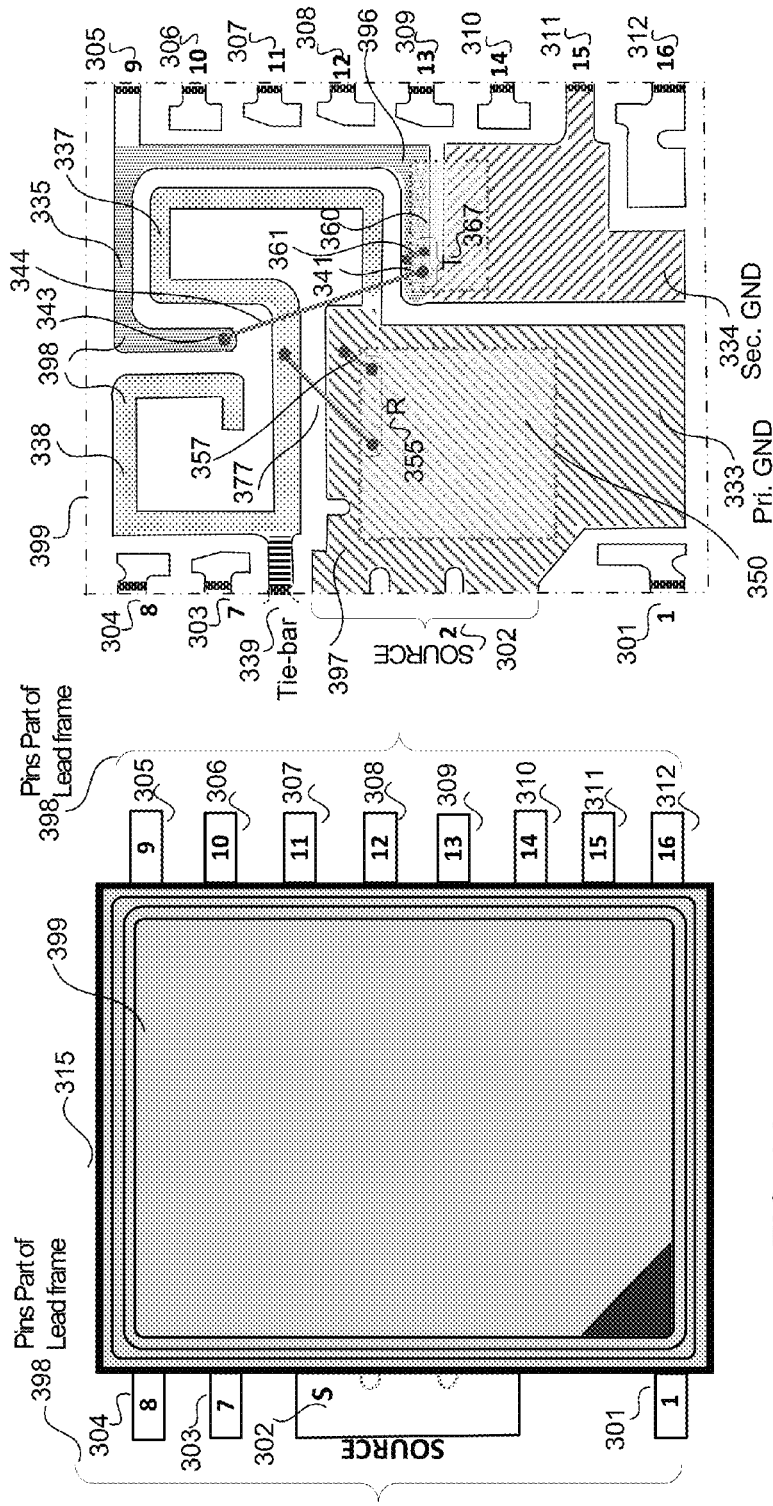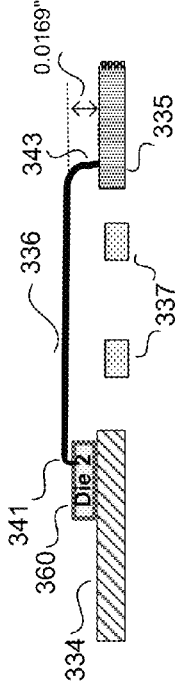

One example of High Side supply through Boot-Strap capacitor.
OR could be by Galvanic isolation of a transformer winding
OR supplied from Drain of high-side switch.

SWITCH MODE POWER CONVERTERS USING MAGNETICALLY COUPLED GALVANICALLY ISOLATED LEAD FRAME COMMUNICATION

RELATED APPLICATIONS

This application is related to U.S. patent application Ser. No. 13/677,088 of Balakrishnan et al., filed Nov. 14, 2012, entitled "Magnetically Coupled Galvanically Isolated Communication Using Lead Frame," and assigned to the Assignee of the present application.

This application is also related to U.S. patent application Ser. No. 13/677,068 of Kung et al., filed Nov. 14, 2012, entitled "Noise Cancellation For A Magnetically Coupled Communication Link Utilizing A Lead Frame," and assigned to the Assignee of the present application.

BACKGROUND INFORMATION

1. Field of the Disclosure

The present invention relates generally to communication between circuits that require galvanic isolation. More specifically, examples of the present invention are related to communication across an isolation barrier in switch mode power converters such as power supplies and power inverters.

2. Background

Switch mode power converters are widely used for household or industrial appliances that require a regulated direct current (dc) source for their operation, such as for example battery chargers that are commonly used in electronic mobile devices. Off-line ac-dc converters convert a low frequency (e.g., 50 Hz or 60 Hz) high voltage ac (alternating current) input voltage to a required level of dc output voltage. Various types of switch mode power converters are popular because of their well regulated output, high efficiency, and small size along with their safety and protection features. Popular topologies of switch mode power converters include flyback, forward, boost, buck, half bridge and full bridge, among many others including resonant types.

Safety requirements for isolated switch mode power converters generally require the use of high frequency transformers to provide galvanic isolation between the inputs and outputs of the switch mode power converters in addition to the voltage level change at the output.

A major challenge in the market of switch mode power converters is reducing the size and cost of the switch mode power converter while maintaining high performance operating specifications. In known isolated switch mode power converters, the sensing of the outputs of the switch mode power converters and communication of feedback signals for regulating switch mode power converter output parameters such as current or voltage is usually accomplished using external isolation components such as, for example, opto-couplers. These known methods add unwanted additional size as well as cost to switch mode power converters. In addition, opto-couplers are slow in operation and in many cases limit the feedback bandwidth and the transient response of the switch mode power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A shows an outside view of an example of an integrated circuit package with a magnetically coupled communication link formed by isolated conductors of the lead frame inside the encapsulated portion the integrated circuit package in accordance with the teachings of the present invention.

FIG. 3B shows an inside view of one example of a lead frame inside an integrated circuit package with a magnetically coupled communication link formed by magnetically coupled conductive loops of isolated conductors of the lead frame inside the encapsulated portion of the integrated circuit package in accordance with the teachings of the present invention.

FIG. 3D shows an example side-view of a jumper bond wire coupled to an integrated circuit die and a conductive loop of an isolated conductor of a lead frame inside an integrated circuit package in accordance with the teachings of the present invention.

Figure 1A:
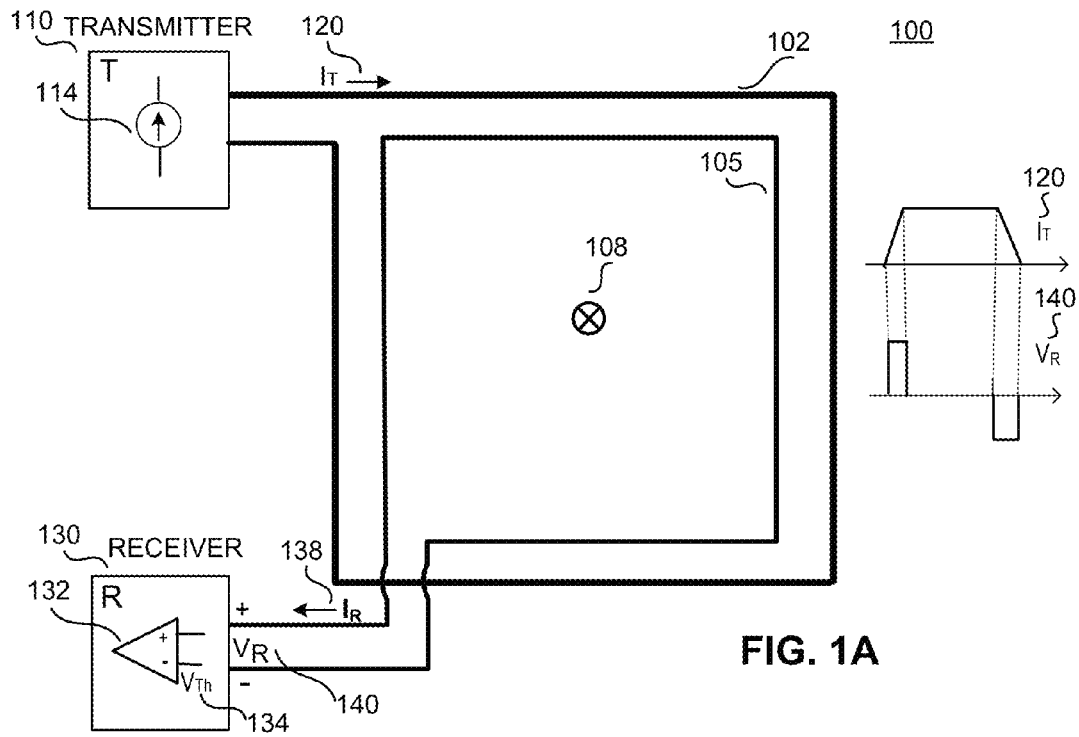
FIG. 1A shows the conceptual operation of magnetically coupled conductive loops transmitting and receiving signals to communicate digital or analog information for the purpose of this disclosure

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In some applications multiple controllers may be housed in a single integrated circuit package. Each controller is fabricated as a semiconductor die. The present application discloses an integrated circuit package structure that enables communication between the controllers with galvanic isolation using magnetic coupling between portions of the lead frame while adding little or no cost to the overall package.

An integrated circuit package typically includes a lead frame. The lead frame provides mechanical support for a single die or for multiple dice that may be housed within the integrated circuit package. In general, the lead frame typically includes a die attach pad to which a semiconductor die may be attached. In addition, the lead frame generally also includes leads that serve as electrical connections to circuits external to the integrated circuit package. The lead frame is generally constructed from a flat sheet of metal. The flat sheet of metal may be stamped, etched, punched, etc., with a pattern, which defines the die attach pads and various leads of the lead frame.

As mentioned above, isolation is often provided in known switch mode power converters using external isolation components such as for example opto-couplers or through the use of an extra bias (e.g., feedback) winding on the transformer core that is magnetically coupled to the secondary winding. These known methods add unwanted additional size as well as overall cost to switch mode power converters. Isolation is provided in examples in accordance with the teachings of the present invention with magnetically coupled conductive loops formed by galvanically isolated conductors of the lead frame inside the encapsulated portion of an integrated circuit package structure, which provides a magnetically coupled communication link between isolated circuits. In various examples, the isolation provided by the magnetically coupled communication link formed by isolated conductors of the lead frame of the integrated circuit package in accordance with the teachings of the present invention may be utilized in a variety of applications including switch mode power converters that require galvanic isolation between the primary and secondary sides of the switch mode power converters. Some example switch mode power converters utilizing an integrated circuit package having a magnetically coupled communication link formed by isolated conductors of the lead frame of the integrated circuit package include, but are not limited to, synchronous flyback, isolated flyback, isolated synchronous flyback, buck, forward, half-bridge and full-bridge topologies in accordance with the teachings of the present invention.

For the purpose of this disclosure, a physical closed path for current is referred to as a loop. A loop may include different elements such as conductors (that in examples of this disclosure could be formed by lead frame and bond wires inside an IC package) as well as electrical components that are in path of the circulating current. Each element in the loop forms a part of the loop, and combination of one or more elements in the loop is referred to as a partial loop. In the context of magnetic field coupling, a loop enclosing a magnetic field is typically referred to as having one or more turns. Each turn corresponds to one enclosure of the magnetic field.

Figure 1B:
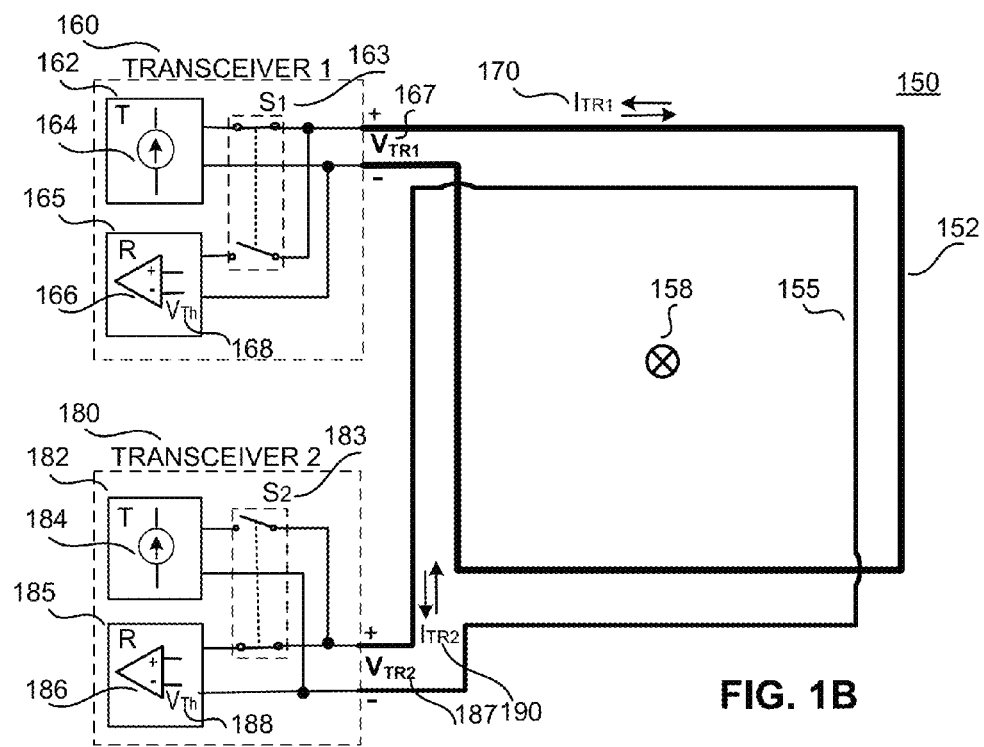
FIG. 1B illustrates another conceptual example of conductive loops suitable for a bidirectional operation according to teaching of this disclosure.

FIGS. 1A and 1B show the conceptual operation of magnetically coupled conductive loops transmitting and receiving signals to communicate operational information for example in a controller IC of a switch mode power converter in accordance with the teachings of the present invention. In FIG. 1A the magnetically coupled communication link 100 includes an outer conductive loop 102 coupled to a transmit circuit 110 and an inner conductive loop 105 coupled to a receive circuit 130. The outer conductive loop 102 in one example includes a pulse current source 114, injecting a pulse current 120 to conductive loop 102. In embodiments, the transmit circuit 110 may communicate information utilizing the transmitter current $I_T$ 120. In one example, circuits within transmit circuit 110 may control various properties of the transmitter current $I_T$ 120 to communicate information to the receive circuit 130. When the transmitter current $I_T$ 120 is changing or varying in magnitude over time, it produces a changing magnetic field in the proximity of the conductor of the inner conductive loop 105. Due to the laws of electromagnetic induction, a voltage is generated across a conductor that is subjected to a changing magnetic field. The pulse current $I_T$ 120 in one example has a time when it is rising, a time when it is falling and an amplitude. The changing flux generated by outer conductive loop 102 due to transmitter current $I_T$ 120 has a direction entering the surface of the page. Marker 108 illustrates the overall magnetic field that passes through both transmitter loop 102 and receiver loop 105. In general, the "X" symbol as illustrated for marker 108 denotes magnetic field or flux into the page, while a dot symbol for a marker symbol denotes magnetic field or flux out from the page.

In the embodiment therefore, receiver voltage $V_R$ 140 is induced due to the changing magnetic field generated by changes in current $I_T$ 120 and may result in receiver current $I_R$ 138 in the direction illustrated in FIG. 1A.

The receive circuit 130 may include circuits which may receive the voltage and/or current induced by the transmit circuit 110 and interprets the voltage and/or current as information. Properties of the transmitter current $I_T$ 120 which may be controlled to communicate information may include the magnitude and rate of change of the transmitter current $I_T$ 120. In the example of depicted transmitter current $I_T$ 120 the rising and falling slopes defined by the pulse waveform 120 induce pulsating voltage $V_R$ 140 with a positive amplitude during rising time and a negative amplitude during falling time of the transmitter current pulse waveform 120. The receive circuit 130 in one example may include a comparator 132 responding to a comparison of the amplitude of induced voltage pulses $V_R$ 140 of receive circuit 130 to a threshold voltage $V_{Th}$ 134.

The communicated signals may take the form of digital information or of analog information. In the case of digital information, communication can be in the form of binary signals or more complex encoded digital data as will be known to one skilled in the art It is appreciated that other communication techniques may be used. In other examples, communication techniques which take advantage of the relationship between the transmitter current $I_T$ 120 and the resultant induced receiver voltage $V_R$ 140 and receiver current $I_R$ 138 received by the receive circuit 130 may be utilized.

FIG. 1B illustrates another example of the magnetically coupled communication link 150. In one example communication link 150 could be suited for bidirectional communication and includes two conductive loops. First loop 152 and second loop 155 are positioned to enclose the maximum common magnetic field area. In contrast to the example of FIG. 1A, that could be better suited to a unidirectional communication, loops 152 and 154 of bidirectional example of FIG. 1B have approximately the same dimensions. For the best bidirectional operation, physical symmetry of the loops is important resulting in approximately equal bidirectional behavior. The magnetic field or flux in the first loop 152 and second loop 155 has a direction into the page.

The operational/functional difference between FIG. 1A and FIG. 1B is that in FIG. 1B both first loop 152 and second loop 155 are coupled to the transceiver (transmit/receive) circuits 160 and 180 respectively. Transceiver circuit 1, 160 through the selection switch S1 163 may couple either a transmit circuit 162 or receive circuit 165 to the first loop 152

Transceiver circuit 2, 180 through the selection switch S2 183 may couple either a transmit circuit 182 or receive circuit 185 to the second loop 155

If the Transceiver circuit 1 160 is coupled as a transmit circuit to inject a current pulse $I_{TR1}$ 170 to the first loop, then Transceiver circuit 2 180 through the second loop 155 and switch S2 183 would be coupled as a receive circuit to receive the communicated signal as a current pulse $I_{TR2}$ 190 or as a voltage pulse $V_{TR2}$ 187.

On the other hand if the Transceiver circuit 2 180 is coupled as a transmit circuit to inject a current pulse $I_{TR2}$ 190 to the second loop, then Transceiver circuit 1 160 through the first loop 152 and by the controlled function of the switch S1 163 would be coupled as a receive circuit to receive the communicated signal as a current pulse $I_{TR1}$ 160 or as a voltage pulse $V_{TR1}$ 167.

The transmit circuits 162 and 182 in the Transceiver circuits 160 and 180 could include pulse current sources 164 and 184 respectively and the receive circuits 165 and 185 in the Transceiver circuits 160 and 180 could include comparator circuits 166 and 186 with threshold voltages 168 and 188 respectively.

Figure 2B:
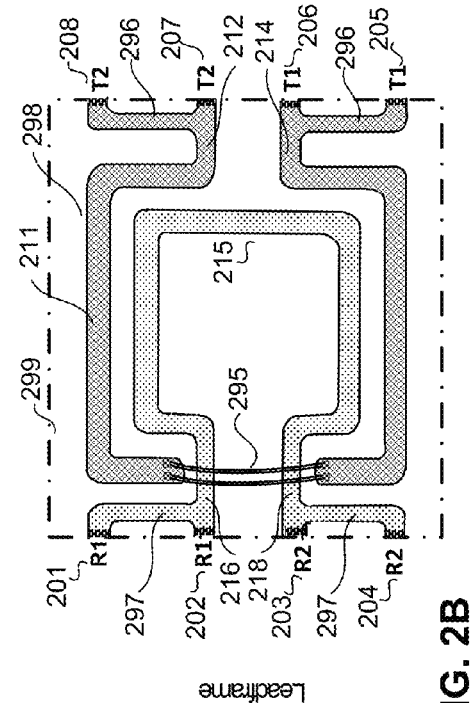
FIG. 2B shows an inside view of one example structure of galvanically isolated magnetically coupled conductive loops formed by isolated conductors of the lead frame inside the example integrated circuit package of FIG. 2A in accordance with the teachings of the present invention.
Figure 2A:
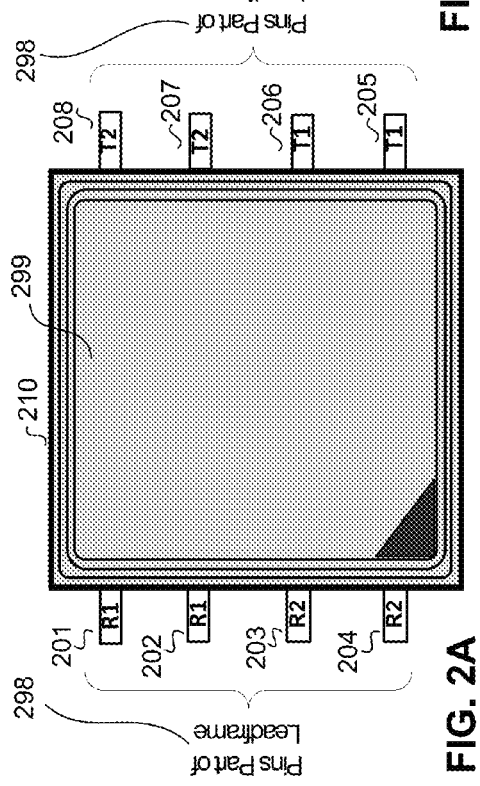
FIG. 2A shows an outside view of one example of an integrated circuit package with galvanically isolated magnetically coupled conductive loops formed by isolated conductors of the lead frame inside the encapsulated portion of the integrated circuit package in accordance with the teachings of the present invention.

To illustrate an example of practical application in IC industry, FIG. 2A and FIG. 2B show an example integrated circuit package 210 with galvanically isolated magnetically coupled conductive loops formed by galvanically isolated conductors of the lead frame inside the encapsulated portion of the integrated circuit package in accordance with the teachings of the present invention. In example illustrated in FIGS. 2A and 2B, there are external pins 201, 202, 203 and 204, as well as external pins 205, 206, 207 and 208, on two sides of integrated circuit package 210. In the example, all of the external pins are part of the lead frame 298 that comprises the internal conductive elements 296 and 297 that are fundamentally part of integrated circuit package 210 before any bond wires, such as bond wires 295, are introduced, and extend from the encapsulation 299 of integrated circuit package 210 as shown. In one example, lead frame 298 may be comprised of known conductive materials utilized for lead frames in integrated circuit packaging, such as for example copper, and is substantially flat and embedded in a molding compound of integrated circuit package 210. In the example, lead frame 298 provides electrical connectivity to and from circuitry coupled to pins 201 to 208 of package 210 as well as provides mechanical support for the connection of bond wires 295.

FIG. 2B shows a view inside the encapsulation 299 revealing one example structure of the galvanically isolated magnetically coupled conductive loops 215 and 211 formed by isolated first and second conductors 296 and 297 of lead frame 298 of the example integrated circuit package 210 of FIG. 2A in accordance with the teachings of the present invention. In particular, as shown in the illustrated example, lead frame 298 includes first conductor 297 and a second conductor 296, which are encapsulated in insulating molding compound material within encapsulation 299. In one example, first and second conductors 297 and 296 of lead frame 298 may be formed from a flat sheet of metal by etching, stamping, punching, or the like, to form first conductive partial loop 215 in first conductor 297, and a second conductive partial loop 211 in second conductor 296. In the example depicted in FIG. 2B, a bond wire 295 is coupled to second conductor 296 as shown to couple together portions of second conductive partial loop 211. In the depicted example, second conductor 296 is galvanically isolated from first conductor 297. In one example, bond wire 295 has a sufficient path length to provide sufficient isolation space from first conductor 297 in order to maintain the galvanic isolation between first conductor 297 and second conductor 296. In another example not illustrated, it is appreciated that one or more additional bond wires may be included coupling together portions of first conductive loop 215 and/or second conductive loop 211. It is appreciated that circuit elements connected between pins 201, 202 and pins 203, 204 are needed to complete the partial conductive loop 215 shown in order to transmit or receive signals through the communication link. Likewise it is appreciated that circuit elements connected between pins 205, 206 and pins 207, 208 are needed to truly complete the partial conductive loop 211 shown in order to transmit or receive signals through the communication link. However for the purposes of this description, partial conductive loops 211 and 215 may be referred to as conductive loops. It is appreciated that this comment also extends to the subsequent discussion of FIG. 1C and FIG. 1D below.

As shown in the example, second conductive loop 211 is disposed within encapsulation 299 proximate to and magnetically coupled to a first conductive loop 215 to provide a communication link between the galvanically isolated first conductor 297 and second conductor 296 in accordance with the teachings of the present invention. In one example, magnetically coupled portions of the first and second conductive loops 215 and 211 are substantially flat and disposed substantially in a same plane. As shown in the illustrated example, the first and second conductive loops 215 and 211 each consist of one turn. In one example, the communication link provided by the magnetic coupling between second conductive loop 211 and first conductive loop 215 is utilized to communicate one or more signals between galvanically isolated second conductor 296 and first conductor 297 of the lead frame 298 in accordance with the teachings of the present invention. In one example, a transmitting signal is applied between first terminal T1 pins 205 and 206, and second terminal T2 pins 207 and 208. It is sometimes desirable to have more than one external pin common to a terminal for convenience of assembly on a circuit board.

Continuing with the illustrated example, the signal is received by first conductive loop 215 through the magnetic coupling from second conductive loop 211 between first terminal R1 pins 201 and 202, and second terminal R2 pins 203 and 204. In another example, it is appreciated that the signal can also be communicated in the opposite direction to provide bidirectional communications.

As shown in the example, first terminal R1 pins 201 and 202 are coupled to first conductive loop 215 through a lead frame connection 216 and second terminal R2 pins 203 and 204 are coupled to first conductive loop 215 through a lead frame connection 218. In the example, the signals at terminals T1 and R1 are in phase in accordance with magnetic coupling and induction laws. In one example, the connections of each terminal T1 214, T2 212, R1 216 and R2 218 to the respective pairs of outside pins 205/206, 207/208, 201/202 and 203/204, as described above, by providing multiple assembly options simplifies the physical connections on a circuit board on which integrated circuit package 210 is mounted.

Figure 2D:
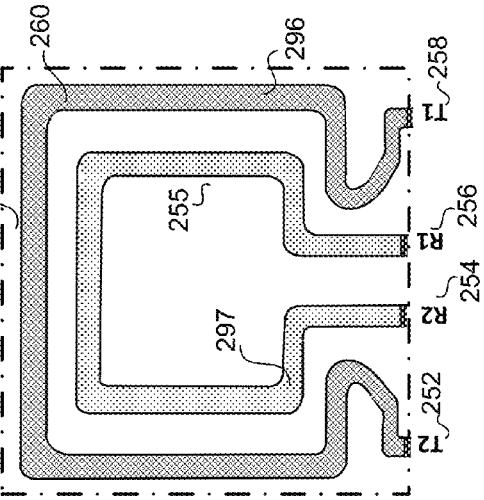
FIG. 2D shows an inside view of one example structure of galvanically isolated magnetically coupled conductive loops formed by isolated conductors of the lead frame inside the example integrated circuit package of FIG. 2C in accordance with the teachings of the present invention.
Figure 2C:
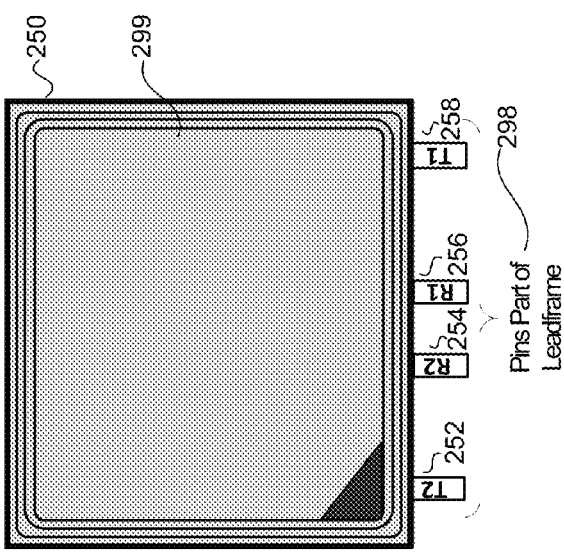
FIG. 2C shows an outside view of one example of an integrated circuit package with galvanically isolated magnetically coupled conductive loops formed by isolated conductors of the lead frame inside the encapsulated portion of the integrated circuit package in accordance with the teachings of the present invention.

FIG. 2C shows an outside view of one example of an integrated circuit package 250 with galvanically isolated magnetically coupled conductive loops formed by isolated conductors of the lead frame 298 inside the encapsulated portion of the integrated circuit package 250 in accordance with the teachings of the present invention. It is appreciated that integrated circuit package 250 of FIG. 2C shares many similarities with integrated circuit package 210 of FIG. 2A. For instance, integrated circuit package 250 of FIG. 2C includes an encapsulation 299 in which a lead frame 298 is disposed. However, one difference is that instead of having external pins arranged at two sides of the integrated circuit package, integrated circuit package 250 includes external pins 252, 254, 256 and 258 arranged on one side of integrated circuit package 250. In the example, all of the external pins are part of the lead frame 298 of integrated circuit package 250 and extend from a single side of the encapsulation 299 of integrated circuit package 250 as shown.

FIG. 2D shows a view inside the encapsulation 299 of one example structure of galvanically isolated magnetically coupled conductive loops 215 and 211 formed by the isolated first and second conductors 297 and 296 of the lead frame 298 of the example integrated circuit package of FIG. 2C in accordance with the teachings of the present invention. It is appreciated that the view inside the encapsulation 299 of integrated circuit package 250 shares many similarities with the view inside the encapsulation 299 of integrated circuit package 210. For instance, as shown in FIG. 1D, lead frame 298 includes first conductor 297 and a second conductor 296 encapsulated in insulating material within encapsulation 299. In the depicted example, second conductor 296 is galvanically isolated from the first conductor 297. As shown in the example, a second conductive loop 260 of second conductor 298 is disposed within encapsulation 298 proximate to and magnetically coupled to a first conductive loop 255 included in first conductor 297 to provide a communication link between the galvanically isolated first conductor 297 and second conductor 296 in accordance with the teachings of the present invention. One difference from the example illustrated in FIG. 2B is that in the example illustrated in FIG. 2D, there is no bond wire 295 included in first conductive loop 255 and/or second conductive loop 260.

In the example illustrated in FIG. 2D, the communication link provided by the magnetic coupling between second conductive loop 260 and first conductive loop 255 is utilized to communicate one or more signals between galvanically isolated second conductor 296 and first conductor 297 of the lead frame 298 in accordance with the teachings of the present invention. In the example, the transmitting signal is applied between first terminal T1 pin 258 and second terminal T2 pin 252. As shown in the example, first terminal T1 pin 258 and second terminal T2 252 are coupled to second conductive loop 260. The signal is received by first conductive loop 255 through the magnetic coupling from second conductive loop 260 between first terminal R1 pin 256 and second terminal R2 pin 254. In another example, it is appreciated that the signal can also be communicated in the opposite direction to provide bidirectional communications.

FIG. 3A shows an outside view of an example of an integrated circuit package 315 with a magnetically coupled communication link formed by isolated conductive loops of the lead frame 398 inside the encapsulation 399 of the integrated circuit package 315 in accordance with the teachings of the present invention. In the example illustrated in FIG. 3A, there are external pins 301, 302, 303, 304, 305, 306, 307, 309, 310, 311 and 312 as shown. In the example, all of the external pins are part of the lead frame 398 of integrated circuit package 315 and extend from the encapsulation 399 of integrated circuit package 315 as shown. In one example, lead frame 398 may be comprised of known conductive materials utilized for lead frames in integrated circuit packaging, such as for example copper, and is substantially flat and encapsulated in a molding compound. In the example, lead frame 398 provides electrical connectivity to and from internal circuitry within encapsulated portion of the integrated circuit package 315 as well as provides mechanical support for integrated circuits and bond wires inside package 315.

FIG. 3B shows a view inside the encapsulation 399 revealing one example the structure of galvanically isolated magnetically coupled conductive loops 337 and 335 formed by isolated first and second conductors 397 and 396 of the lead frame 398 of the example multi-die isolated controller integrated circuit package 315 of FIG. 3A in accordance with the teachings of the present invention. In particular, as shown in the illustrated example, lead frame 398 includes first conductor 397 and a second conductor 396 encapsulated in insulating material within encapsulation 399. As shown in the depicted example, a first conductor 397 includes a first conductive loop 337 and second conductor 396 includes a second conductive loop 335. As shown in the example, second conductive loop 335 is disposed within encapsulation 399 proximate to and magnetically coupled to a first conductive loop 337 to provide a communication link between the galvanically isolated first conductor 397 and second conductor 396 in accordance with the teachings of the present invention. In one example, first conductor 397 also includes an optional third conductive loop 338, which in one example may be utilized for noise cancellation and is attached to tie bar 339 as shown. In one example, tie-bar 339 provides a mechanical support connection during the manufacture of package 315 before the lead frame 398 is encapsulated with encapsulation 399. In one example the encapsulation 399 is injection molded with a molding compound. The communication link provided by the magnetic coupling between second conductive loop 335 and first conductive loop 337 is utilized to communicate one or more signals between the galvanically isolated second conductor 396 and first conductor 397 of the lead frame 398 in accordance with the teachings of the present invention.

In FIG. 3B the current signal from transmit circuit 367 that in one example is included in controller die 360, assembled on the die pad 334, is injected through the bond wire 344 from node 341 of transmit circuit 367. The current signal flows to the end node 343 of the bond wire 344 and then completes the second loop 335, flowing through the lead frame back to the transmit circuit 367 through the bond wire 361. The injected signal generates a changing magnetic field that induces a voltage signal in the first conductive loop 337 and results in a current signal closing from the first conductive loop 338 to the receive circuit 335 through the bond wires 377 and 357. The receive circuit 335 may be included in the first controller die 355 assembled on the die pad 333 that is the primary ground.

Figure 3C:
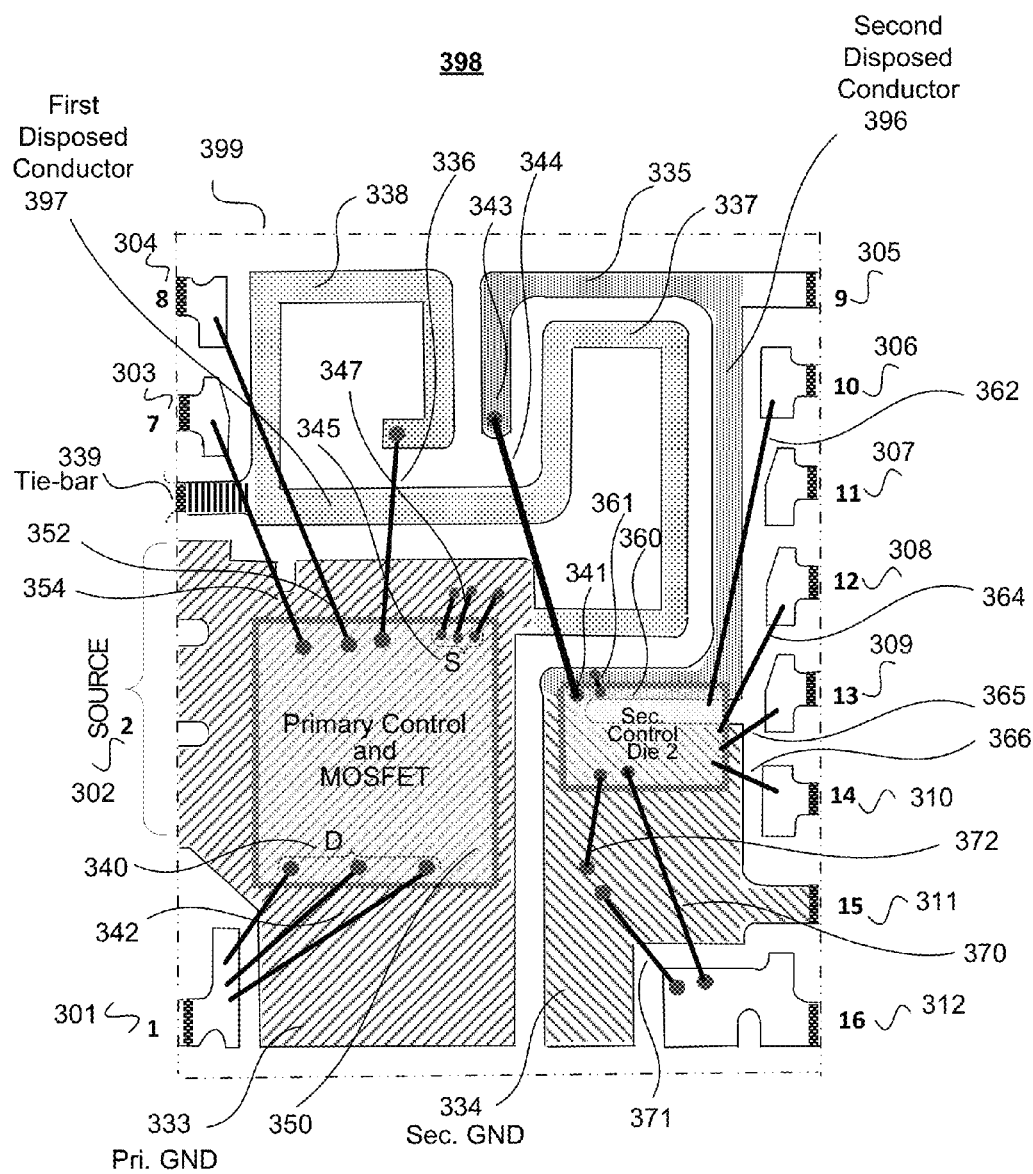
FIG. 3C shows an inside view of an example of a lead frame of a multi-die isolated controller integrated circuit package with a magnetically coupled communication link between the controller dice, the link being formed by magnetically coupled conductive loops of isolated conductors of the lead frame inside the encapsulated portion of the integrated circuit package in accordance with the teachings of the present invention.

FIG. 3C shows another view inside the encapsulation 399 in which a first control die 350 is mounted on and coupled to the first conductor 397 and a second control die 360 is mounted on and coupled to the second conductor 396 in accordance with the teachings of the present invention. In the illustrated example, first control die 350 is mounted on die pad 333 and second control die 360 is mounted on die pad 334 as shown. In the illustrated example, die pads 333 and 334 are utilized as primary and secondary ground pads, respectively. In the example shown in FIG. 3C, a magnetically coupled communication link between the first control die 350 and second control die 360 is formed by the magnetically coupled communication link between the first conductive loop 337 and second conductive loop 335 in accordance with the teachings of the present invention. In one example, multi-die isolated controller integrated circuit package 315 may be utilized in a switch mode power converter such as for example a synchronous flyback switch mode power converter with secondary control in accordance with the teachings of the present invention.

Products and applications that require low output voltages, such as for example 5V and below, in some cases, use synchronous rectification to achieve high efficiency and compact form factor. Synchronous rectification utilizes a MOSFET (metal oxide semiconductor field effect transistor) that is switched to behave like a rectifier, in place of an output rectifier diode, to reduce voltage drop and power loss. The switching action of an output MOSFET rectifier is synchronized with the main power switch with well-controlled gating signals. In one example, first control die 350 includes a primary control circuit and a switch (in one example a MOSFET) for use in the primary side of a synchronous flyback switch mode power converter, and the second control die 369 includes a secondary control circuit for use in the secondary side of the synchronous flyback switch mode power converter. In various examples, the primary control circuit and switch/MOSFET may be implemented with a monolithic or hybrid structure for the first control die 350.

As shown in the example illustrated in FIG. 3C, the primary switch (or MOSFET) is included in first control die 350. In one example, the drain terminal D 340 of the MOSFET is coupled through bond wires 342 to pin 301. The source terminal S 345 of the MOSFET is coupled through bond wires 347 to the primary ground die pad 333, which is accessible through source pin 302. In the illustrated example, there is a wide clearance (i.e., missing pins) between drain pin 301 and source pin 302. In the illustrated example, the wide pad of source pin 302 is internally coupled to a primary ground pad 333, which may also serve as a heat sink. In one example, pins 303 and 304 are coupled to first control die 350 through bond wires 352 and 354, respectively, to connect the first control die 350 to external circuitry such as for example line under voltage (example of UV 536 in FIG. 5) and supply bypass capacitor (example of BP 531 in FIG. 5).

Bond wire 336 couples the third conductive loop 338 to the first control die 350. Due to a changing magnetic field generated by a changing current flowing in second conductive loop 335, a voltage signal is induced in the first conductive loop 337. In the example of FIG. 3C first conductive loop 337 is coupled to the third conductive loop 338 (the optional noise cancellation loop that is an extension of the first conductive loop). The induced voltage signal is coupled through bond wires 336 and 347 to the receive circuit that in one example is included in the primary die 350 on the primary ground die pad 333.

In the example, pin 305 is attached to second conductive loop 335 of second conductor 396 for mechanical support. The signal communicated from second control die 360 is coupled to second conductive loop 335 through bond wires 344 and 361, which complete the second conductive loop 335. As shown in the example, bond wire 344 is a connection coupling second conductive loop 335 at point 343 to second control die 360 at point 341. Pin 312 in one example is coupled through the current sense bond wire 371 to the secondary Ground pad 334 and the sensed voltage drop on bond wire 371 is coupled to second control die 360 through bond wires 370 and 372 and is utilized for a secondary current measurement. In one example, the bond wires 362, 364, 365 and 366 are coupled between second control die 360 and pins 306, 307, 308, 309 and 310, respectively, and are utilized for the input/output of secondary signals. In one example, pin 311 provides access to secondary ground pad 334 as shown.

In one example, the slot on secondary ground pad 334 under the second control die 360 makes the second conductive loop 335 longer by forcing the current through the second conductive loop 335 to ground pad 334 to flow closer and parallel to the first conductive loop 337 to improve magnetic coupling. The smaller first conductive loop 337 proximate to and surrounded by the second conductive loop 335 provides a strong magnetic coupling of first and second conductive loops in accordance with the teachings of the present invention. In one example, lead frame 398 is flat, but in other examples some portions of the lead frame 398 may be up set and/or down set for optimum vertical positioning to accommodate die thickness, optimizing bond wire profiles and to align to tie bars and external pins of the integrated circuit package 315.

FIG. 3D shows an example side-view of a bond wire 336, which as mentioned above is an electrical connection, and is coupled to second control die 360 at point 341 and second conductive loop 335 at point 343 of the second conductive loop 335 in accordance with the teachings of the present invention. As shown in the example, bond wire 336 is at a higher level than the level of second conductive loop 335 and pin pad 334 of lead frame 398. As shown, bond wire 336 has sufficient span to complete second conductive transmitter loop 335 and to be isolated from the first conductive loop 337.

Figure 4A:
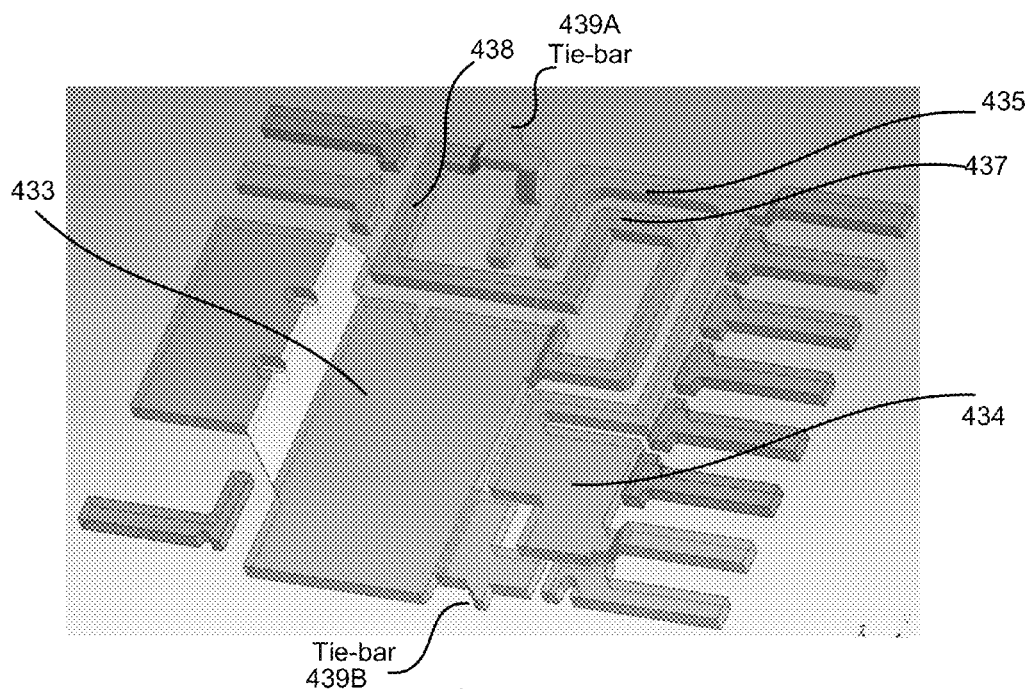
FIG. 4A shows a tilted 3D (3 dimensional) view of an inside view of one example of a lead frame of an integrated circuit package with a magnetically coupled communication link formed by magnetically coupled conductive loops of isolated conductors of the lead frame inside the encapsulated portion of the integrated circuit package in accordance with the teachings of the present invention.
Figure 4B:
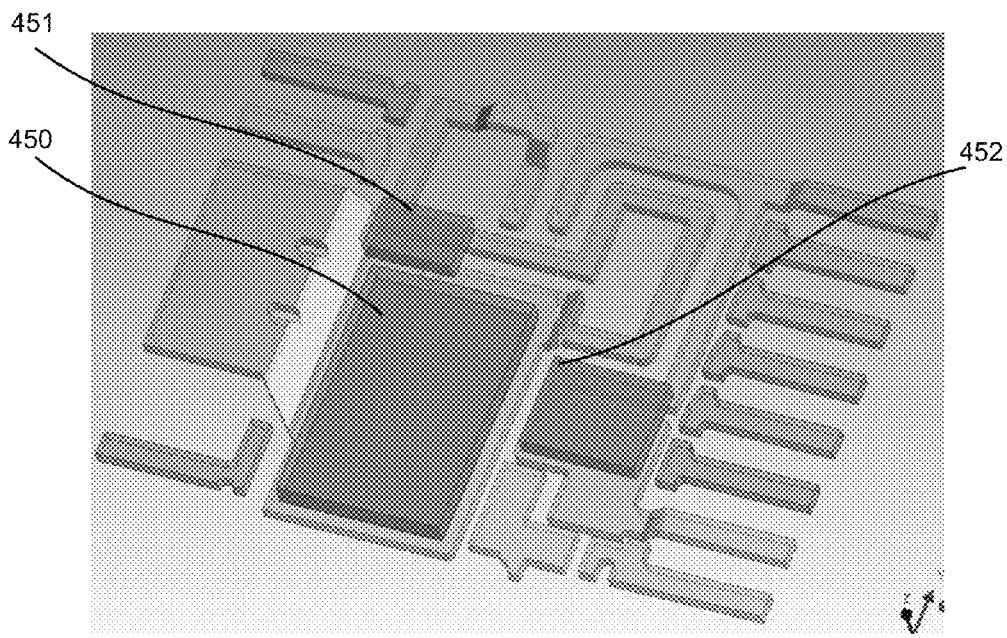
FIG. 4B shows a tilted 3D view of an inside view of one example of a lead frame of a multi-die isolated controller integrated circuit package with a communication link between the controller dice formed by magnetically coupled conductive loops formed by isolated conductors of the lead frame inside the encapsulated portion of the integrated circuit package in accordance with the teachings of the present invention.

FIG. 4A shows a tilted 3D (3 dimensional) view of an inside view of one example of a lead frame of an integrated circuit package with a magnetically coupled communication link that is formed with magnetically coupled conductive loops of isolated conductors of the lead frame inside the encapsulated portion of the integrated circuit package in accordance with the teachings of the present invention. FIG. 4A shows the illustrated lead frame structure shares similarities with the lead frame 398 structures of FIG. 3B and FIG. 3C. In particular, in the example of FIG. 4A, the lead frame structure includes a first conductor including a primary die pad 433 and a first conductive loop 437, as well as a third conductive loop 438, which correspond to die pad 333, first conductive loop 337, as well as third conductive loop 338, respectively, of FIGS. 3B and 3C. In addition, in the example of FIG. 4A, the lead frame structure also includes a second conductor including a secondary die pad 434 and a second conductive loop 435, which correspond to die pad 334 and second conductive loop 335, respectively, of FIGS. 3B and 3C. In FIGS. 4A and 4B the tie-bar connection 439A to support the third conductive loop 438 is at a different location than the tie-bar connection 339 to support the third conductive loop 338 in FIGS. 3B and 3C and the tie-bar connection 439B of FIGS. 4A and 4B is not present in the lead frame 398 of FIGS. 3B and 3C. Consequently, the lead frame design shown in FIGS. 3A, 3B and 3C has no tie bar connections on the top and bottom sides of the encapsulation increasing the external creepage distance between the primary and secondary conductors of the lead frame to the shortest distance between external pins 304 and 305 or between external pins 301 and 312, whichever is smaller, measured along the external surface of the encapsulation.

FIG. 4B shows a tilted 3D view of another inside the encapsulation view of one example of a lead frame of a multi-die isolated controller integrated circuit package with a communication link between the controller dice that are formed with magnetically coupled conductive loops of isolated conductors of the lead frame inside the encapsulated portion of the integrated circuit package in accordance with the teachings of the present invention. FIG. 4B shows a lead frame structure sharing similarities with the lead frame structure shown in FIG. 4A. In the example illustrated in FIG. 4B, the primary and secondary dice are shown mounted on the lead frame. As shown in the illustrated example, the primary switch 450 and controller 451 are on different dice—which is commonly referred to as a hybrid structure. In the example of FIG. 4B, the power MOSFET has a high power rating, which results in a separate die 450 having a large size that covers substantially all of the primary ground die pad 433. In the illustrated example, the primary control die 451 is mounted over part of the third conductive loop 438 as shown. The secondary control die 452 is mounted on the secondary ground die pad 434 as shown.

It is appreciated that an integrated circuit package having a magnetically coupled communication link between galvanically isolated conductors of the lead frame inside the encapsulated portion of the integrated circuit package in accordance with the teachings of the present invention may be utilized in a variety of different applications. Although several different switch mode power converter topologies utilizing such an integrated circuit package having a magnetically coupled communication link are described herein, it is appreciated that the specific examples described in this disclosure are provided for explanation purposes, and that other applications may utilize a magnetically coupled communication link between galvanically isolated conductors of a lead frame inside the encapsulated portion of an integrated circuit package in accordance with the teachings of the present invention.

Figure 5:
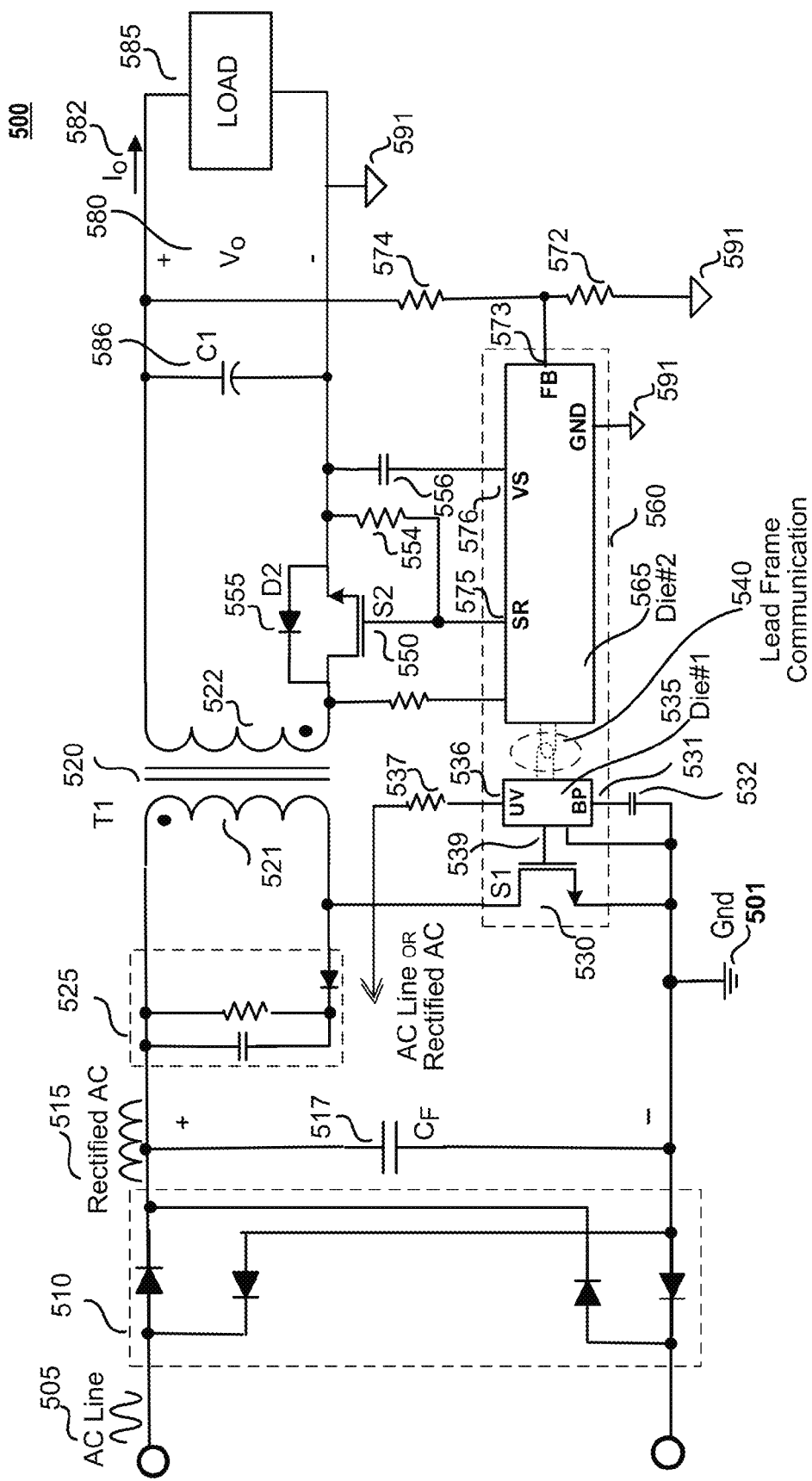
FIG. 5 shows a schematic of one example of a synchronous flyback switch mode power converter with secondary control utilizing one example of a multi-die isolated controller integrated circuit package with a magnetically coupled communication link between the controller dice formed by isolated conductors of the lead frame inside the encapsulated portion of the integrated circuit package in accordance with the teachings of the present invention.

To illustrate, FIG. 5 shows one such example application with a schematic of an example synchronous flyback switch mode power converter 500 with secondary control utilizing one example of a multi-die isolated controller integrated circuit package 560 having a magnetically coupled communication link 540 between the controller dice that is formed with galvanically isolated conductors of a lead frame inside the encapsulated portion of the integrated circuit package 560 in accordance with the teachings of the present invention.

It is appreciated that secondary control for a flyback converter has advantages of tighter output regulation and faster response to load transients. However, as discussed previously, conventional methods of secondary control often use external isolation devices, such as for example opto-couplers, which increase the complexity and cost of the switch mode power converter. By using an example multi-die isolated controller integrated circuit package 560 having a magnetically coupled communication link 540 with isolated primary and secondary control dice, externally added isolation components such as opto-couplers are no longer needed in accordance with the teachings of the present invention. Furthermore, since integrated circuit package 560 provides a magnetically coupled communication link by using the lead frame of the integrated circuit package as discussed previously, galvanic isolation is maintained between the primary and secondary sides of the switch mode power converter at nearly zero additional cost, without having to add external isolation components in accordance with the teachings of the present invention.

In the example synchronous flyback switch mode power converter 500, the primary and secondary controllers are galvanically isolated from one another, but there is still reliable communication between the primary and secondary controllers. It is appreciated that although the example of FIG. 5 shows a synchronous flyback converter, a standard flyback converter, where synchronous MOSFET 550 is replaced by a diode, would also benefit from the teachings of the present invention.

In the example illustrated in FIG. 5, synchronous flyback switch mode power converter 500 includes an input coupled to an ac line 505 as shown. A full-bridge rectifier 510 is coupled to ac line 505 to generate rectified ac 515, which is filtered by capacitance $C_F$ 517. The rectified ac 515 is coupled to be received by energy transfer element 520, which includes a primary winding 521 and a secondary winding 522 as shown. In the illustrated example, clamp circuit 525 is coupled across primary winding 521 of energy transfer element 520 as shown.

In the depicted example, a switching device S1 530 is coupled to the input of synchronous flyback switch mode power converter 500 at the primary ground 501 and to the energy transfer element 520 at primary winding 521. In the illustrated example, switching device S1 530 may be included in a monolithic or hybrid structure in the integrated circuit package 560. As shown in the depicted example, switching device S1 is controlled by control signal 539 from the primary controller die 535 and regulates the energy transfer through primary winding 521 of transformer 520 to the secondary winding 522 in response to line and load changes. Clamp circuit 525, which in the illustrated example is a diode-resistor-capacitor circuit, is coupled to clamp the turn-off spikes that result from the leakage inductance from primary winding 521 across the switching device S1 530.

As shown in the example of FIG. 5, switch S2 550 and anti-parallel diode D2 555 are coupled to secondary winding 522 at the secondary side and serve as a synchronous rectifier of synchronous flyback switch mode power converter 500. In one example, the diode D2 555 is an externally connected Schottky diode. In one example, switch S2 550 is controlled by a signal from the SR pin of the secondary controller die 565. Whenever the voltage at SR terminal 575 rises to a value higher than the gate threshold voltage, the synchronous rectifier provided by switch S2 550 begins conducting current. The secondary ripple is smoothed by output filter capacitance C1 586 and the dc output voltage Vo 580 is applied to load 585 with load current Io 582. The output voltage Vo 580 is sensed through the resistor divider comprised of resistors 572 and 574, which is coupled to the feedback pin FB 573 of the secondary controller. It is appreciated that in other examples resistors 574 and 572 could be integrated within integrated circuit 560 while still benefiting from the teachings of the present invention.

At startup, primary die 535, which is referenced to the primary ground 501, starts the switching of switch S1 530, which starts the transfer of energy to the secondary side. The bypass pin BP 531 is externally coupled to the bypass capacitor 532. The line under voltage pin UV 536 is externally coupled through resistor 537 to the ac input line, which in another example could be coupled to a rectified ac bus 515. Communication between the primary die 535 and secondary die 565 is through a magnetic coupling provided by a magnetically coupled communication link 540 formed by isolated conductors of the lead frame of the integrated circuit package in accordance with the teachings of the present invention. In various examples, the communication link 540 is implemented using galvanically isolated conductive loops included in the lead frame of the integrated circuit package as described above in accordance with the teachings of the present invention.

Figure 6:
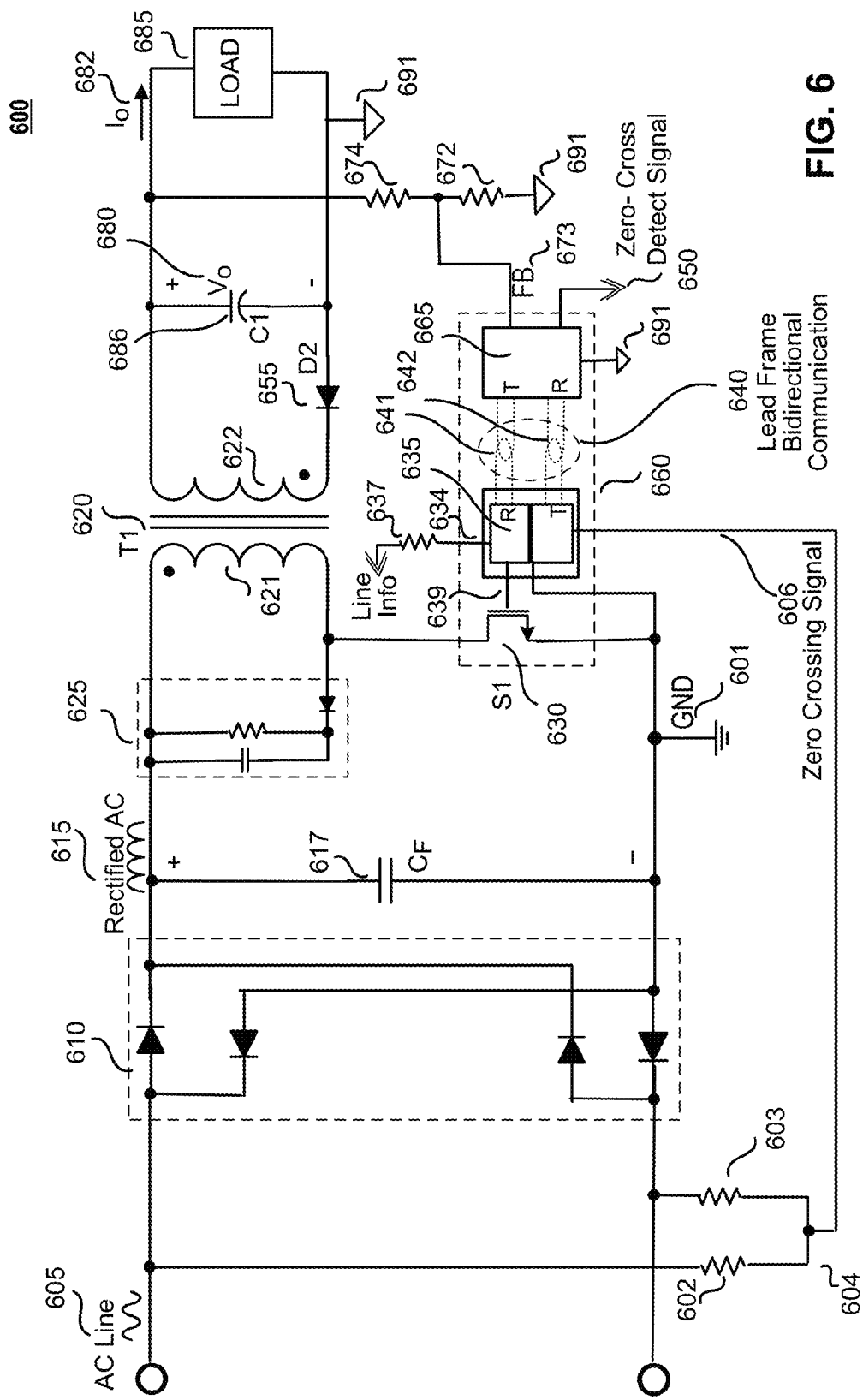
FIG. 6 shows a schematic of one example of a flyback switch mode power converter utilizing one example of a multi-die isolated controller integrated circuit package including a bidirectional magnetically coupled communication link between the controller dice inside the encapsulated portion of the integrated circuit package in which output information is transferred to a primary side through the magnetically coupled communication link and an AC line zero-cross detection signal is transferred to the secondary side through the magnetically coupled communication link in accordance with the teachings of the present invention.

FIG. 6 shows a schematic of one example of a flyback switch mode power converter 600 utilizing one example of a multi-die isolated controller integrated circuit package including a bidirectional magnetically coupled communication link between the controller dice inside the encapsulated portion of the integrated circuit package in which output information is transferred to a primary side through the magnetically coupled communication link and a line zero-cross detection signal is transferred to the secondary side through the magnetically coupled communication link in accordance with the teachings of the present invention.

In the example illustrated in FIG. 6, flyback switch mode power converter 600 includes an input coupled to an ac line 605 as shown. A full-bridge rectifier 610 is coupled to ac line 605 to generate rectified ac 615, which is filtered by capacitance $C_F$ 617. The rectified ac 615 is coupled to be received by energy transfer element 620, which includes a primary winding 621 and a secondary winding 622 as shown. In the illustrated example, clamp circuit 625 is coupled across primary winding 621 of energy transfer element 620 as shown.

In the depicted example, a switching device S1 630 is included in an integrated circuit package 660. In one example, the switch die and the primary control die may be structured as monolithic or hybrid dice. In the example, switching device S1 630 is coupled to the input of flyback switch mode power converter 600 at the primary ground 601 and to the energy transfer element 620 at primary winding 621. As shown in the depicted example, switching device S1 630 is controlled by control signal 639 from the primary controller die 635 and regulates the energy transfer through primary winding 621 of transformer 620 to the secondary winding 622 in response to line and load changes. Clamp circuit 625, which in the illustrated example is a diode-resistor-capacitor circuit, is coupled to clamp the turn-off spikes that result from the leakage inductance from primary winding 621 across the switching device S1 630. In the illustrated example, the secondary rectifier diode D2 655 in flyback only conducts current during an off-time of the primary switch 630.

The secondary ripple is filtered by the output filter capacitance C1 686 and the dc output voltage Vo 680 is applied to the load 685 with load current Io 682. The output voltage Vo 680 is sensed through resistor divider comprised of resistors 672 and 674, which is coupled to the feedback pin FB 673 of the secondary controller die 665 and is referenced to secondary ground 691 isolated from the primary ground 601. In one example, feedback signal 673 is a data signal that is transmitted through the magnetic coupling of the lead-frame communication loop 641 and received by the primary die 635 in reference to the primary ground 601. In one example, the FB signal 673, transferred by lead frame magnetic coupling of the communication link 640 to the primary side controller die 635, may be either a digital or an analog signal. FB signal is utilized in combination with the input line information received at pin 634 through resistor 637 to generate gate control signal 639 to control the switching of switch S1 630 to regulate the transfer of energy through energy transfer element 620 to the output. In one example, lead frame communication link 640 includes unidirectional communication links 641 and 642 to transmit one or more control signals between dice 665 and 635 in accordance with the teachings of the present invention. In another example, lead frame communication link 640 includes a single bidirectional communication link (as depicted in FIG. 1B) using the same magnetically coupled lead frame loop to transmit one or more control signals in either direction between dice 665 and 635 in accordance with the teachings of the present invention.

In one example, the specific control function of the example flyback switch mode power converter 600 of FIG. 6 also utilizes a zero-cross signal of the ac line that is sensed at ac line input 605 through the shunt connected resistors 602 and 603 at the common point 604 referenced to the primary ground 601 as shown. In the example, zero sense signal 606 is coupled to primary die 635 and referenced to primary ground 601, and is transmitted through the magnetic coupling of the lead-frame communication loop 642 and received by the secondary die 665 with reference to the secondary ground 691, which could be utilized as an isolated remote control signal. For example, the zero-cross signal (a pulse synchronous with the ac input voltage passing through zero at every line cycle) could be utilized as an isolated signal for some electric appliances, such as for example washing machines to sense line frequency or generate timing signals necessary for an efficient load switching in the appliance.

As shown in the illustrated example, the lead frame communication link 640 is bidirectional and includes two unidirectional communication links 641 and 642. Communication link 642 is unidirectional in a reverse direction of lead frame communication link 641. It is appreciated that even though in the illustrated example the individual lead frame communication links are described as unidirectional communication links, in another example, a single lead frame communication link can be utilized in a bidirectional implementation (as presented, for example, in FIG. 1B) instead of two unidirectional communication links in accordance with the teachings of the present invention.

Even though the magnetically coupled communication link built in accordance with the teachings of this invention provides galvanic isolation, one skilled in the art would appreciate that the overall system, such as a switch mode power converter, that practices this invention need not necessarily be galvanically isolated between the input and output of the system to benefit from the advantages of this invention. For example, in non-isolated converters, a galvanically isolated communication link in accordance with the teachings of the present invention allows communication between two parts of a switch mode power converter that are referenced to different voltages which could be fixed or changing relative to each other over time.

Figure 7:
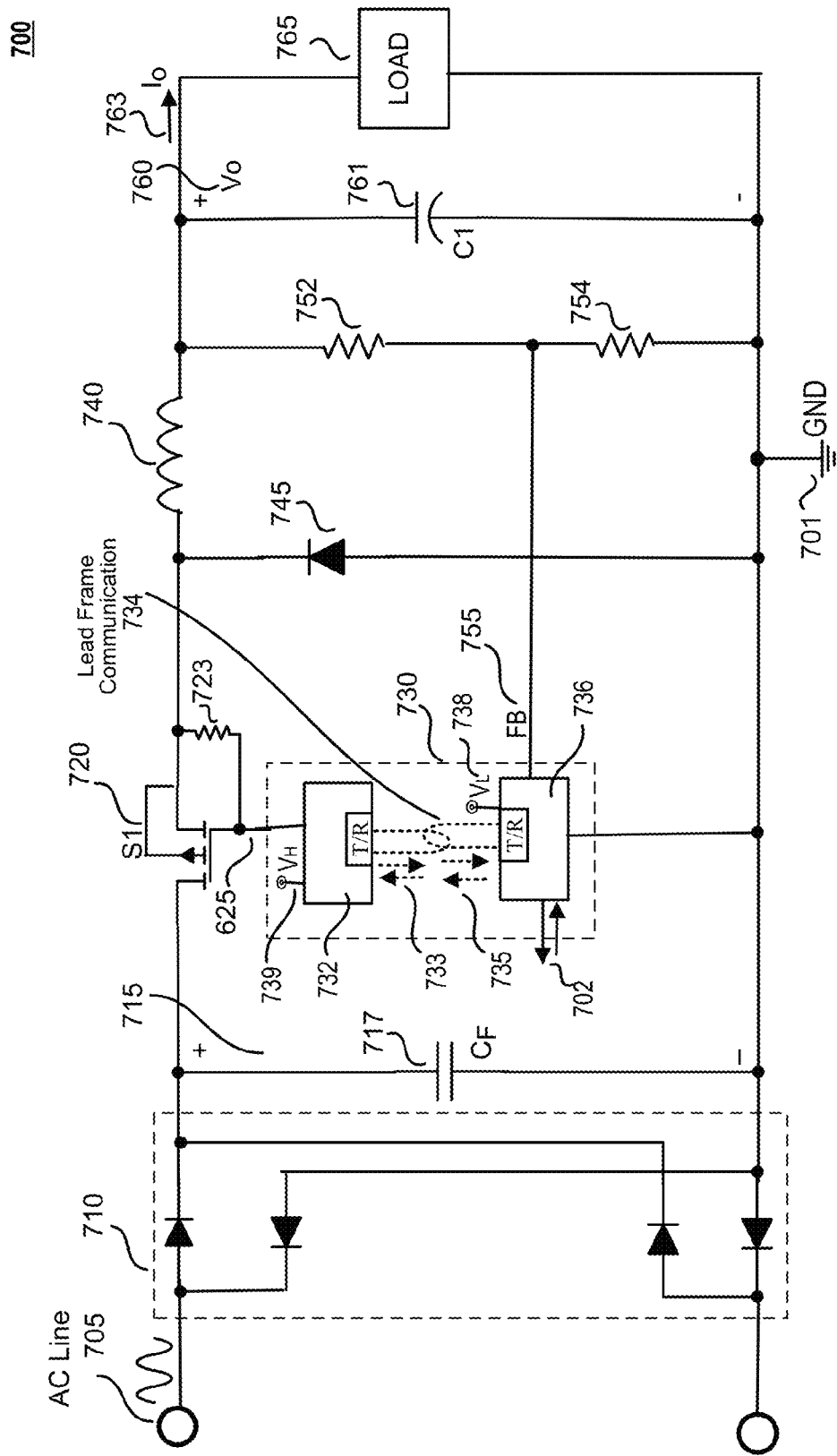
FIG. 7 shows a schematic of one example of a buck converter utilizing one example of a multi-die isolated controller integrated circuit package with a magnetically coupled communication link formed by isolated conductors of the lead frame inside the encapsulated portion of the integrated circuit package in accordance with the teachings of the present invention.

FIG. 7 shows a schematic of one example of a buck converter 700 utilizing one example of a multi-die isolated controller integrated circuit package with a magnetically coupled communication link formed by isolated conductors of the lead frame inside the encapsulated portion of the integrated circuit package in accordance with the teachings of the present invention.

In the example illustrated in FIG. 7, buck converter 700 includes an input coupled to an ac line 705 as shown. A full-bridge rectifier 710 is coupled to ac line 705 to generate rectified ac 715, which is filtered by capacitance $C_F$ 717. The ac line 705 is rectified through bridge rectifier 710 and the rectified AC 715 is filtered by the capacitance $C_F$ 717 and applied to a high-side switch depicted as an N-channel MOSFET switch S1 720. In the example, MOSFET switch S1 720 is turned on by applying control signal 725. In particular, when the gate to source voltage across the gate resistor 723 rises above the gate threshold voltage, MOSFET S1 720 is turned on.

An energy transfer element 740, which in the illustrated example is an inductor 740, is coupled to MOSFET switch S1 720 as shown. In operation, energy is transferred to the inductor 740 of the buck converter 700 through the switching control of MOSFET switch S1 720. In particular, when MOSFET switch S1 720 is on, energy is transferred to the inductor 740 and during an off time of the MOSFET switch S1 720, the energy stored in the inductor 740 is delivered to the load 765 by circulating the load current 763 through the load 765 and circulating diode 745. The regulated output voltage Vo 760 is filtered by capacitance C1 761.

In the illustrated example, the switching control signal 725 for the high-side MOSFET switch S1 720 in a non-isolated buck converter is isolated from the converter reference ground 701. Feedback signal FB 755 is generated from output voltage Vo 760 through a resistive divider including resistors 752 and 754, and is input to the controller die 736, which is referenced to the converter ground 701. In the illustrated example, the incoming/outgoing control signals 702 are coupled to the controller die 736. In one example, the incoming/outgoing control signals 702 may include for example an incoming switching signal and outgoing status/fault protection signals, and are referenced to the converter ground 701. In the example, the control signals 702 are communicated between the isolated high-side control die 732 and controller die 736 through a bidirectional communication link provided by the magnetic coupling of first and second conductive loops of the lead frame inside the integrated circuit package in accordance with the teachings of the present invention. In one example, the supply voltage to the lower control die 736 is $V_L$ 738, which is referenced to converter ground 701, and the supply voltage to the high side control die 732 is $V_H$ 739, which is referenced to the source of MOSFET switch S1 720.

It is appreciated that in other examples, synchronous buck converters may be implemented with the circulating diode 745 being replaced by a controlled switch with reverse current conduction. Switching in that example of the controlled switch is synchronized with the high-side buck main MOSFET switch S1 720. It is appreciated that the controller circuit for a synchronous buck converter can also benefit in the same way as other examples from a magnetically coupled communication link through galvanically isolated first and second conductive loops of the lead frame in accordance with the teachings of the present invention. In addition, it is noted that another example schematic of a synchronous converter could utilize a half-bridge configuration.

Figure 8A:
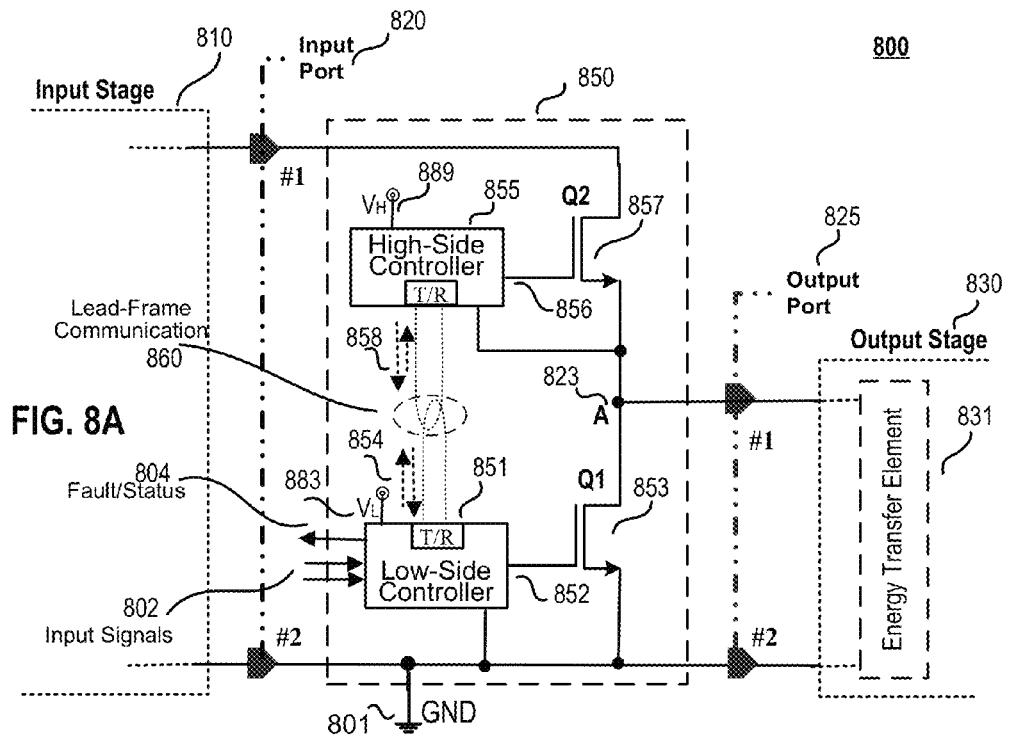
FIG. 8A shows a schematic of an example of a switch mode power converter including one example of a portion of a half-bridge converter utilizing an example of a multi-die isolated controller integrated circuit package with a magnetically coupled communication link formed by isolated conductors of the lead frame inside the encapsulated portion of the integrated circuit package in accordance with the teachings of the present invention.
Figure 8B:
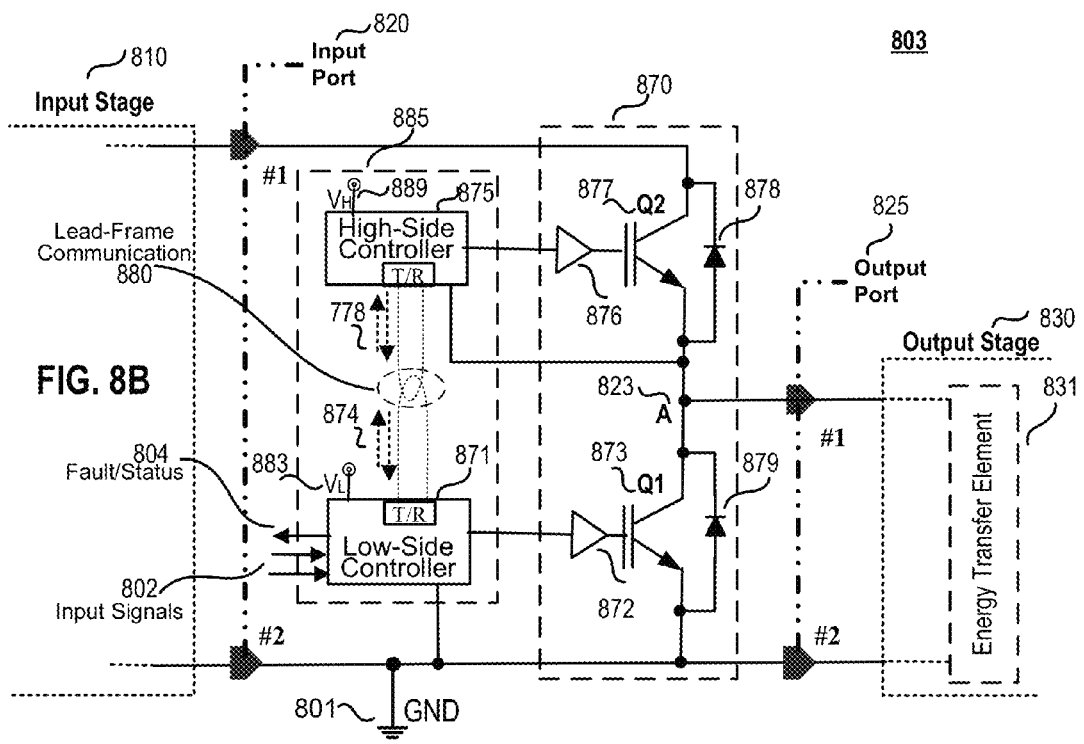
FIG. 8B shows a schematic of an example of a switch mode power converter including another example of a portion of a half-bridge converter utilizing an example of a multi-die isolated controller integrated circuit package with a magnetically coupled communication link formed by isolated conductors of the lead frame inside the encapsulated portion of the integrated circuit package in accordance with the teachings of the present invention.
Figure 8C:
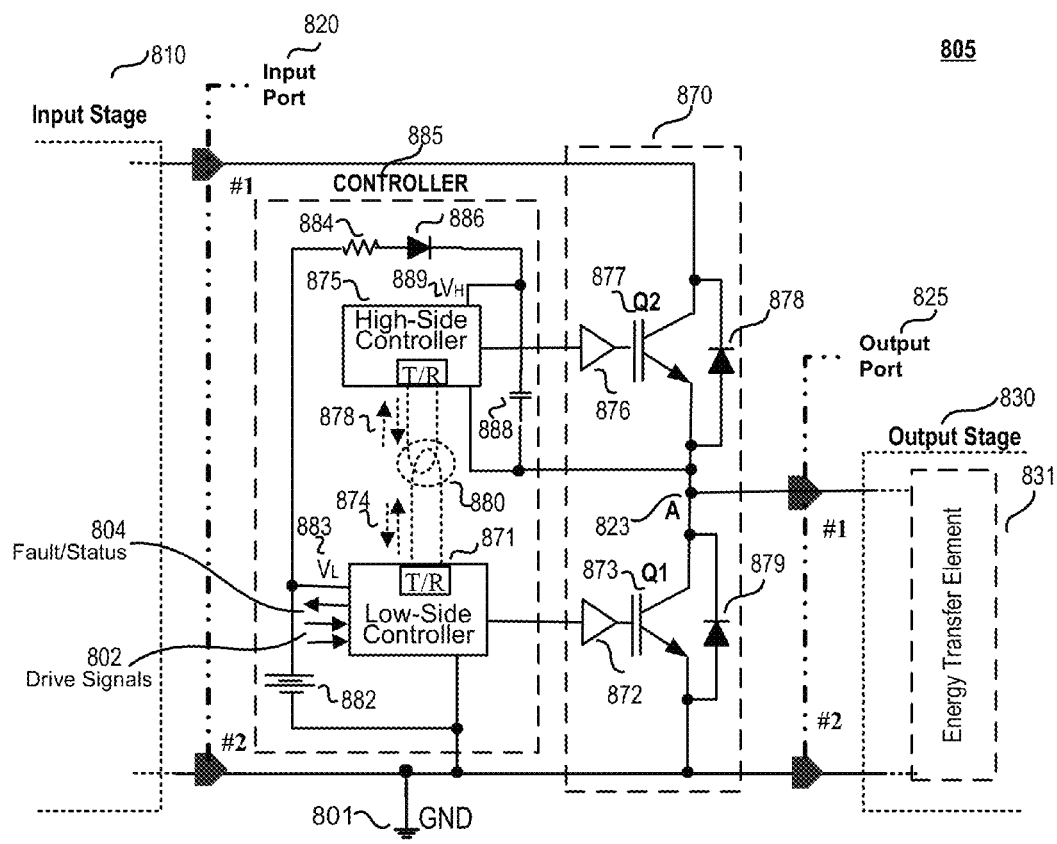
FIG. 8C shows a schematic of an example of a switch mode power converter including yet another example of a portion of a half-bridge converter utilizing an example of a multi-die isolated controller integrated circuit package with a magnetically coupled communication link formed by isolated conductors of the lead frame inside the encapsulated portion of the integrated circuit package in accordance with the teachings of the present invention.

FIGS. 8A, 7B and 8C introduce integrated circuit package examples having isolated control circuits utilizing magnetically coupled first and second conductive loops of a lead frame in an integrated circuit package to provide communication links in various half-bridge configurations in accordance with the teachings of the present invention. For instance, FIG. 8A shows a schematic of an example of a switch mode power converter 800 including one example of a half-bridge configuration 850 that may be included in an example of a multi-die isolated controller integrated circuit package with a magnetically coupled communication link that is formed by isolated conductors of the lead frame inside the encapsulated portion of the integrated circuit package in accordance with the teachings of the present invention. As shown, an input stage 810 provides a dc voltage to half-bridge configuration 850 at input terminals of an input port 820 of half-bridge configuration 850. In one example, half-bridge configuration 850 generates high frequency pulses at output terminals of an output port 825 of half-bridge configuration 850, which are coupled to drive an energy transfer element in an output stage 730 of the switch mode power converter 800.

In the illustrated example, half-bridge configuration 850 includes a switching leg coupled to the input port 820 and output port 825. The switching leg includes a high-side switch Q2 857 and a low-side switch Q1 853 that are coupled to drive the energy transfer element in output stage 830 as shown. A plurality of control circuits are coupled to control switching of the high-side switch Q2 857 and low-side switch Q1 853. In the illustrated example, one of the plurality of control circuits is high-side controller 855, which is coupled to control high-side switch Q2 857 with a control signal 856 that is referenced to the source of high-side switch Q2 857, which is connected to half-bridge mid-point A 823 and to the high potential terminal #1 of the half-bridge output port 825 as shown. Another one of the plurality of control circuits is low-side controller 851, which is coupled to control low-side switch Q1 853 with a control signal 852 that is referenced to the source of low-side switch Q1 853 and ground reference 801. Accordingly, in one example, high-side controller 755 and low-side controller 851 are galvanically isolated from one another. As shown in the depicted example, there is a magnetically coupled communication link 860 between isolated high-side controller 855 and low side controller 851 through which one or more control signals may be communicated.

In one example, the isolated low-side controller 851 and the high-side controller 855 dice are included in a single integrated circuit package in which communication link 860 is included in the integrated circuit package with a magnetically coupled communication link formed by galvanically isolated conductors of the lead frame inside the encapsulated portion of the integrated circuit package in accordance with the teachings of the present invention. In one example, communication link 860 is a bidirectional link between respective transceiver circuits of the galvanically isolated low-side controller 851 and the high-side controller 855 dice. In another example, communication link 860 includes a plurality of unidirectional links between respective transmit circuits and receive circuits of the galvanically isolated low-side controller 851 and the high-side controller 855 dice. In one example, the control signals 852 and 856 of the low-side and high-side switching devices 853 and 857, respectively, are synchronized tightly to avoid any overlapped switching of high-side and low-side switches 853 and 857 that could result in shoot through between the input port 820 terminals.

In one example, low side controller 851 is coupled to receive input control signals 802 as shown. In one example, the control signals 852 and 856 are coupled to drive the low-side and high-side switching devices 853 and 857 in response to the input control signal 802. In one example, low-side controller 851 is further coupled to output a status signal 804, which in one example may include fault/status information and may be used to protect the half-bridge converter in the case of fault conditions. In one example, the status signal 804 may include fault/status information regarding the switch Q1 873 from the low-side controller 851 as well as fault/status information regarding the switch Q2 877 from the high-side controller 855 received by low-side controller 851 through communication link 860.

In one example, supply $V_L$ 885 is coupled to the low-side controller 851 and is referenced to ground reference 801. Supply $V_H$ 889 is coupled to the high-side controller 855 and is referenced to half-bridge midpoint A 823. One example of a high-side supply through a bootstrap capacitor is depicted below in FIG. 8C. In other examples, the high-side supply could be provided by a galvanically isolated winding on a transformer or the high-side supply could be supplied from the drain of the high-side switch.

FIG. 8B shows a schematic of another example of a switch mode power converter 803 including one example of a half-bridge configuration 870 that may be included in an example of a multi-die isolated controller integrated circuit package with a magnetically coupled communication link formed by isolated conductors of the lead frame inside the encapsulated portion of the integrated circuit package in accordance with the teachings of the present invention. It is appreciated that switch mode power converter 803 of FIG. 8B shares many similarities with switch mode power converter 800 of FIG. 8A. For instance, switch mode power converter 803 of FIG. 8B includes an input stage 810 that provides a dc voltage to half-bridge configuration 870 at input terminals of an input port 820 of half-bridge configuration 870. In one example, half-bridge configuration 870 generates high frequency pulses at output terminals of an output port 825 of half-bridge configuration 870, which are coupled to drive an energy transfer element in an output stage 830 of the switch mode power converter 803.

In addition, half-bridge configuration 870 includes a switching leg coupled to the input port 820 and output port 825. The switching leg includes a high-side switch Q2 877 and a low-side switch Q1 875 that are coupled to drive the energy transfer element in output stage 830 as shown. A plurality of control circuits is coupled to control switching of the high-side switch Q2 877 and low-side switch Q1 875. In the illustrated example, one of the plurality of control circuits is high-side controller 875, which is coupled to control high-side switch Q2 877. Another one of the plurality of control circuits is low-side controller 871, which is coupled to control low-side switch Q1 875.

One difference between switch mode power converter 803 of FIG. 8B and switch mode power converter 800 of FIG. 8A is that in the example switch mode power converter 803 of FIG. 8B, the low-side and high-side switching devices, which are depicted as IGBTs (insulated gate bipolar transistors) Q1 875 and Q2 877 with drivers 872 and 876, are not included in the controller integrated circuit package 885 of the low-side and high-side controllers 871 and 875. In one example, the configuration of switch mode power converter 803 of FIG. 8B is more suited for high voltage high power half-bridge applications. In applications in which IGBT switches are used and a reverse current conduction by the switches is required, such as the depicted example switch mode power converter 803 of FIG. 8B, the switches Q1 875 and Q2 877 should include internal or external anti-parallel diodes depicted by diode 879 across IGBT Q1 875 and anti-parallel diode 878 across IGBT Q2 877.

In one example, high-side controller 875 and low-side controller 871 are galvanically isolated from one another. In particular, the low-side controller supply $V_L$ 883 is referenced to ground reference 801 and the high-side controller supply $V_H$ 889 is isolated from the low-side controller supply $V_L$ 883 and referenced to the half-bridge midpoint A 823. The input control signals 802 for driving half-bridge switches are coupled to the low-side controller that controls both the high-side and the low-side switching. As shown in the depicted example, there is a communication link 880 between isolated high-side controller 875 and low side controller 871 through which one or more control signals may be communicated. In one example, the isolated low-side controller die 871 and the high-side controller die 875 are included in a single integrated circuit package in which communication link 860 is included in the integrated circuit package with a magnetically coupled communication link formed by isolated conductors of the lead frame inside the encapsulated portion of the integrated circuit package 885 in accordance with the teachings of the present invention. In one example, communication link 880 is a bidirectional link between respective transceiver circuits of the galvanically isolated low-side controller die 871 and the high-side controller die 875. In another example, communication link 880 includes a plurality of unidirectional links between respective transmit circuits and receive circuits of the galvanically isolated low-side controller die 871 and the high-side controller die 875.

In one example, low-side controller 871 is further coupled to output a status signal 804, which in one example may include fault/status information and may be used to protect the half-bridge converter in the case of fault conditions. In one example, the status signal 804 may include fault/status information regarding the switch Q1 873 from the low-side controller 871 as well as fault/status information regarding the switch Q2 877 from the high-side controller 875 received by low-side controller 871 through communication link 880.

FIG. 8C shows an example of a switch mode power converter 805, which shares many similarities with switch mode power converter 803 of FIG. 8B. In particular, all of the components of the front-stage 810, output stage 830, half-bridge configuration 870 and the integrated circuit package 885 of switch mode power converter 803 of FIG. 8B are also included in switch mode power converter 805 of FIG. 8C. In the example depicted in FIG. 8C, a bootstrap capacitor is also included to provide the high-side controller 875 supply voltage $V_H$ 889 through the bootstrap capacitor 888, which is isolated from the low side controller supply and the low-side ground reference 801. In one example, bootstrap capacitor 888 is charged from the low-side controller supply 882 coupled to the low-side controller supply terminal $V_L$ 883 as shown. In every switching cycle when low-side switch Q1 875 is closed and high-side switch Q2 877 is open, the bootstrap capacitor 888 is charged through diode 886 and resistor 884 from the supply 882 with respect to ground reference 801. In addition, bootstrap capacitor 888 is coupled to supply $V_H$ 889 to the high-side controller 875 when low-side switch Q1 875 is open, high-side switch Q2 877 is closed, and high voltage is applied to the midpoint A 823.

It is appreciated that in another example, an isolated supply voltage may also be provided to the high-side controller through an isolated bias or supply winding from a transformer. In yet another example, voltage may be supplied to the high-side controller from the drain terminal of the high side switch.

Figure 9A:
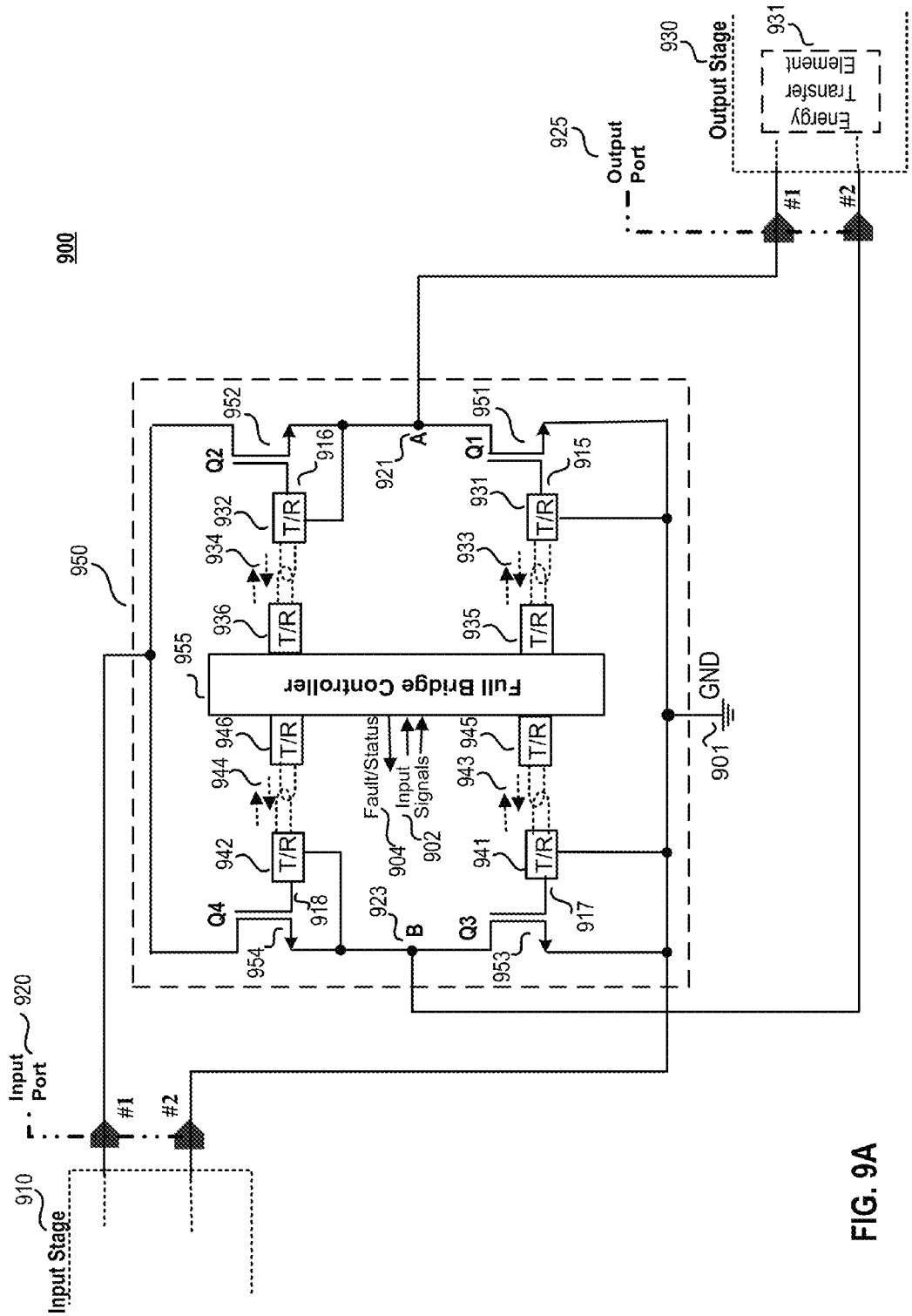
FIG. 9A shows a schematic of an example of a switch mode power converter including one example of a portion of a half-bridge converter utilizing an example magnetically coupled communication link formed by isolated conductors of the lead frame inside the encapsulated portion of the integrated circuit package in accordance with the teachings of the present invention.

FIG. 9A shows a schematic of an example of a switch mode power converter 900 including one example of a full-bridge configuration 950 utilizing an example of four bidirectional magnetically coupled communication links formed by isolated conductors of the lead frame inside the encapsulated portion of the integrated circuit package in accordance with the teachings of the present invention. In one example, full-bridge configuration 950 may be included in an example of a multi-die isolated controller integrated circuit package with a magnetically coupled communication link formed by isolated conductors of the lead frame inside the encapsulated portion of the integrated circuit package in accordance with the teachings of the present invention. As shown, an input stage 910 provides a dc or low frequency voltage to full-bridge configuration 950 at input terminals of an input port 920 of full-bridge configuration 950. In one example, full-bridge configuration 950 generates high frequency pulses at output terminals of an output port 925 of full-bridge configuration 950, which are coupled to drive an energy transfer element in an output stage 930 of the switch mode power converter 900.

In the illustrated example, full-bridge configuration 950 includes first and second switching legs coupled to input port 920 and output port 925. As shown in the depicted example, one of the switching legs includes a low-side switch Q1 951 coupled to a high-side switch Q2 952. The other switching leg includes a low-side switch Q3 953 coupled to a high-side switch Q4 954. The first and second switching legs are coupled to drive the energy transfer element in output stage 930 in response to respective control signals that are coupled to be received from a respective one of a plurality of control circuit dice. In the illustrated example, control circuit die 931 is coupled to generate a control signal 915 to control switching of low-side switch Q1 951. Control circuit die 932 is coupled to generate a control signal 916 to control switching of high-side switch Q2 952. Control circuit die 941 is coupled to generate a control signal 917 to control switching of low-side switch Q3 953. Control circuit die 942 is coupled to generate a control signal 918 to control switching of high-side switch Q4 954.

In the example, control signals 915 and 917 generated from control circuit dice 931 and 941, respectively, are referenced to ground reference 901. Control signals 916 and 918 generated from control circuit dice 932 and 942, respectively, are referenced to the source of the high-side switches Q2 952 and Q4 954, respectively, or in other words are referenced to the half-bridge mid-points A 921 and B 923, respectively).

In the example depicted in FIG. 9A, full-bridge configuration 950 is implemented with a full-bridge controller 955 in an integrated circuit package. In one example, the integrated circuit package may include isolated multiple controller dice for the high-side and low-side switches as well as the drivers and switching devices.

In the example illustrated in FIG. 9A, the input signals 902 and the status signals 904 to and from the full-bridge controller 955 correspond to the operational parameters and fault/status conditions of the switch mode power converter 900. As shown in the example of FIG. 9A, one or more control signals may be communicated between transceiver circuitry 935 of full-bridge controller 955 and control circuit die 931 through communication link 933. One or more control signals may be communicated between transceiver circuitry 936 of full-bridge controller 955 and control circuit die 932 through communication link 934. One or more control signals may be communicated between transceiver circuitry 945 of full-bridge controller 955 and control circuit die 941 through communication link 943. One or more control signals may be communicated between transceiver circuitry 946 of full-bridge controller 955 and control circuit die 942 through communication link 944. In one example, communication links 933, 934, 943 and 944 are implemented using a magnetic coupling of isolated conductive loops formed using the lead frame and bond wires of the integrated circuit package in accordance with the teachings of the present invention. In one example the communication links 933, 934, 943 and 944 are bidirectional. In another example, communication links 933, 934, 943 and 944 may contain a plurality of unidirectional links to provide bidirectional communications.

Figure 9B:
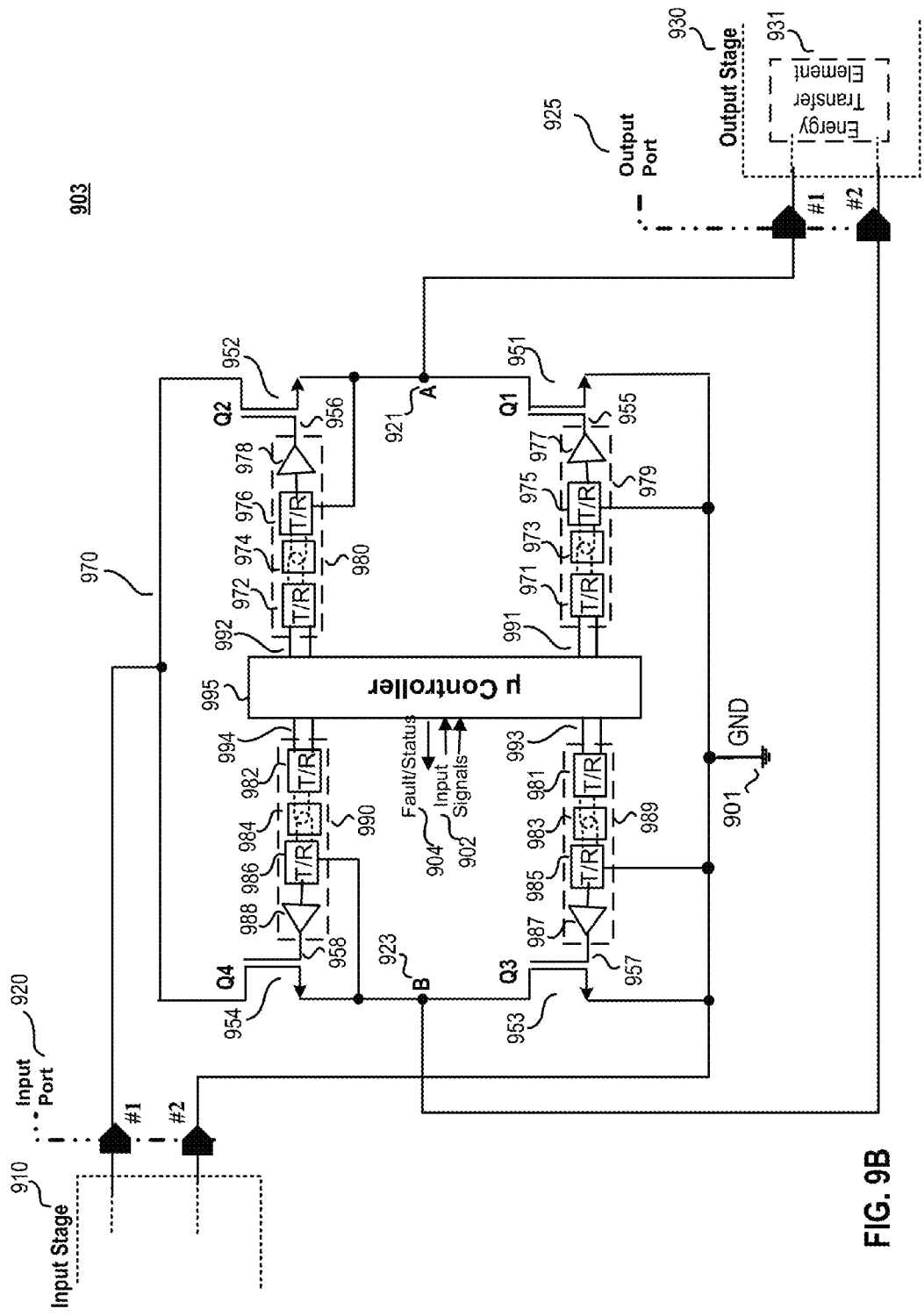
FIG. 9B shows a schematic of an example of a switch mode power converter including another example of a portion of a half-bridge converter utilizing an example magnetically coupled communication link formed by isolated conductors of the lead frame inside the encapsulated portion of the integrated circuit package in accordance with the teachings of the present invention.

FIG. 9B shows a schematic of an example of a switch mode power converter 903 including another example of a full-bridge configuration 970 utilizing an example magnetically coupled communication link formed by isolated conductors of the lead frame inside the encapsulated portion of the integrated circuit package in accordance with the teachings of the present invention. It is appreciated that switch mode power converter 903 of FIG. 9B shares many similarities with switch mode power converter 900 of FIG. 9A. For instance, switch mode power converter 903 of FIG. 9B includes an input stage 910 that provides a dc or low frequency voltage to full-bridge configuration 970 at input terminals of an input port 920 of full-bridge configuration 970. In one example, full-bridge configuration 970 generates high frequency pulses at output terminals of an output port 925 of full-bridge configuration 970, which are coupled to drive an energy transfer element in an output stage 930 of the switch mode power converter 903.

In addition, full-bridge configuration 970 includes first and second switching legs coupled to input port 920 and output port 925. As shown in the depicted example, one of the switching legs includes a low-side switch Q1 951 coupled to a high-side switch Q2 952. The other switching leg includes a low-side switch Q3 953 coupled to a high-side switch Q4 954. The first and second switching legs are coupled to drive the energy transfer element in output stage 930 in response to respective control signals that are coupled to be received from a microcontroller 995 of the full-bridge configuration 970.

In the depicted example, a microcontroller 995 is programmed with a switching program to control the full-bridge configuration 970 to control the switching of switches Q1 951, Q2 952, Q3 953, and Q4 954. In one example, the incoming switching signals 902 and the outgoing status signals 904 to and from the microcontroller 995 correspond to the operational parameters and fault/status conditions of the switch mode power converter 903. In one example, microcontroller 995 generates control signals 991, 992, 993 and 994 in response to the input signals 902. In one example, control signal 991 is communicated through a module 979, which outputs a control signal 955 coupled to control the switching of low side switch Q1 951. Control signal 992 is communicated through a module 980, which outputs a control signal 956 coupled to control the switching of high side switch Q2 952. Control signal 993 is communicated through a module 989, which outputs a control signal 957 coupled to control the switching of low side switch Q3 953. Control signal 994 is communicated through a module 990, which outputs a control signal 958 coupled to control the switching of high side switch Q4 954.

In example illustrated in FIG. 9B, it is noted that each module 979, 980, 989 and 990 includes an integrated circuit package 973, 974, 983 and 984, respectively. In one example, integrated circuit packages 973, 974, 983 and 984 share substantial similarities with the integrated circuit package 210 and/or integrated circuit package 250 as described above with respect to FIGS. 2A, 2B, 2C and 2D. Accordingly, each integrated circuit package 979, 974, 975 and 976 includes galvanically isolated magnetically coupled conductive loops formed by isolated conductors of the lead frame inside the respective encapsulated portion of the integrated circuit package in accordance with the teachings of the present invention. Therefore, the transceiver circuits or transmit/receive circuits coupled on opposite ends of each integrated circuit package 979, 974, 975 and 976 are galvanically isolated, but are still able to communicate in accordance with the teachings of the present invention. It is appreciated that each transceiver circuitry and/or the transmit/receive circuitry included in each module 979, 980, 989 and 990 can be referenced to the source terminal of controlled switch regardless of microcontroller 995 ground reference.

In one example, each of the modules 979, 980, 989 and 990 are substantially similar to each other and each includes similar components. To illustrate with reference to the specific example of module 979, transceiver circuits 971 and 975 of module 979 communicate through integrated circuit package 973 as shown. In one example, a driver 977 for boosting the signal to drive the low side switch Q1 951 can also be included in the module 979. In one example, the utilization of the individual modules 979, 980, 989 and 990 is well suited for the high power rating full-bridge converter designs.

In one example, each of the modules 979, 980, 989 and 990 is an integrated circuit package that contains the dice for the transmit/receive circuitry, optional driver and a galvanically isolated communication link formed by isolated conductors of the lead frame inside the encapsulated portion of the integrated circuit package in accordance with the teachings of the present invention.

For the purposes of this disclosure, an "encapsulation" of an integrated circuit package may be considered to be any external body, encasing or molding that surrounds or encloses a portion of the lead frame which may include one or more integrated circuit dice disposed therein, as well as connections from the integrated circuit die pads to the lead frame and pins of the integrated circuit package. An example encapsulation may be made from molded non-ferrous insulating material, plastic, ceramic covers or the like. In some examples, the encapsulation of the integrated circuit package may or may not provide hermetic sealing to protect the items encased therein from external elements.

For the purposes of this disclosure, the term "integrated circuit package" refers to the type of packages used generally for integrated circuits. It is appreciated that some embodiments of this invention may have no integrated circuits in the package such as the examples in FIGS. 2A, 2B, 2C and 2D.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An integrated circuit package for use in a switch mode power converter, comprising:
   an encapsulation;
   a lead frame, a portion of the lead frame disposed within the encapsulation, the lead frame including a first conductor having a first conductive loop disposed substantially within the encapsulation, wherein the lead frame further includes a second conductor galvanically isolated from the first conductor, wherein the second conductor includes a second conductive loop disposed substantially within the encapsulation proximate to and magnetically coupled to the first conductive loop to provide a communication link between the first and second conductors;

a first control die including a first control circuit coupled to the first conductor; and a second control die including a second control circuit coupled to the second conductor, wherein one or more control signals are communicated between the first and second control dice through the communication link, wherein the switch mode power converter comprises a switching circuit coupled between an input of the power supply and an input of an energy transfer element, the output of the energy transfer element coupled to an output of the switch mode power converter, wherein the first control circuit coupled to the switching circuit to control switching of the switching circuit in response to the one or more control signals communicated between the first and second control dice through the communication link to regulate the transfer of energy from the input of the switch mode power converter to the output of the switch mode power converter.

2. The integrated circuit package of claim 1 wherein the switch mode power converter comprises an isolated synchronous flyback converter, and wherein the switch mode power converter further comprises:

a second switch coupled to an output of the energy transfer element and the output of the switch mode power converter; and the second control circuit coupled to receive a feedback signal representative of the output of the switch mode power converter, wherein the second control circuit is further coupled to the second switch to control switching of the second switch to transfer energy from the energy transfer element to the output of the switch mode power converter, wherein the second control circuit transmits the one or more control signals through the communication link to the first control circuit to regulate the transfer of energy from the input of the switch mode power converter to the output of the switch mode power converter.

3. The integrated circuit package of claim 1 wherein the switch mode power converter comprises an isolated flyback converter, and wherein the second control circuit is coupled to receive a feedback signal representative of the output of the switch mode power converter, wherein the one or more control signals is responsive to the feedback signal, and wherein the second control circuit transmits the one or more control signals through the communication link to the first control circuit to regulate the transfer of energy from the input of the switch mode power converter to the output of the switch mode power converter.

4. The integrated circuit package of claim 3 wherein the second control circuit is further coupled to receive an AC line zero-crossing signal from the first control circuit through the communication link between the first and second control dice.

5. The integrated circuit package of claim 1 wherein the switch mode power converter comprises a buck converter, wherein the first control circuit is a high-side control circuit, and wherein the second control circuit is coupled to receive a feedback signal representative of the output of the switch mode power converter, wherein the one or more control signals are responsive to the feedback signal, wherein the second control circuit is coupled to transmit the one or more control signals through the communication link to the high-side control circuit.

6. The integrated circuit package of claim 1 wherein the switch mode power converter comprises a half-bridge converter that includes a switching leg having a high-side switch and a low-side switch coupled to drive the energy transfer element, wherein the first control circuit is one of a plurality of control circuits, wherein each one of the plurality of control circuits is coupled to control switching of a respective one of the high-side and low-side switches.

7. The integrated circuit package of claim 6 wherein a status signal is communicated from the first control circuit to an other one of the plurality of control circuits through the communication link.

8. The integrated circuit package of claim 1 wherein the switch mode power converter comprises a full-bridge converter that includes first and second switching legs, wherein each one of the first and second switching legs comprises a high-side switch and a low-side switch coupled to drive the energy transfer element, wherein the first control circuit is one of a plurality of control circuits, wherein each one of the plurality of control circuits is coupled to control switching of a respective one of the high-side and low-side switches.

9. The integrated circuit package of claim 8 wherein a status signal is communicated from the control circuit to a full-bridge controller circuit through the communication link.

10. The integrated circuit package of claim 1 wherein the first control die is mounted on the first conductor of the lead frame, wherein the first control die is coupled to and completes the first conductive loop.

11. The integrated circuit package of claim 10 further comprising a first bond wire coupled to the first conductor and the first control die, wherein the first bond wire is included as a portion of the first conductive loop.

12. The integrated circuit package of claim 10 wherein the second control die is mounted on the second conductor of the lead frame, wherein the second control die is coupled to the second conductive loop.

13. The integrated circuit package of claim 12 further comprising a second bond wire coupled to the second conductor and the second control die, wherein the second bond wire is included as a portion of the second conductive loop.

14. The integrated circuit package of claim 1 wherein the one or more control signals comprise a coded signal.

15. The integrated circuit package of claim 1 wherein the communication link comprises a unidirectional communication link.

16. The integrated circuit package of claim 1 wherein the communication link comprises a bidirectional communication link.

17. A switch mode power converter, comprising:
a switching circuit coupled to an input of an energy transfer element and an input of the switch mode power converter;

the energy transfer element coupled between the switching circuit and an output of the switch mode power converter;

a control circuit coupled to the switching circuit to control switching of the switching circuit to regulate a transfer of energy from the input of the switch mode power converter to the output of the switch mode power converter;

a first conductor including a first conductive loop coupled to the control circuit, wherein the first conductor is included in a lead frame of an integrated circuit package; and a second conductor included in the lead frame of the integrated circuit package and galvanically isolated from the first conductor, wherein the second conductor includes a second conductive loop disposed proximate to and magnetically coupled to the first conductive loop to provide a communication link between the first and second conductors, wherein the control circuit is coupled to switch the switching circuit in response to one or more control signals received from the second conductive loop through the magnetic coupling between the first and second conductive loops, wherein the first and second conductive loops are coupled to respective external pin pads of the integrated circuit package.

18. A switch mode power converter, comprising:
a switching circuit coupled to an input of an energy transfer element and an input of the switch mode power converter;
the energy transfer element coupled between the switching circuit and an output of the switch mode power converter;
a control circuit coupled to the switching circuit to control switching of the switching circuit to regulate a transfer of energy from the input of the switch mode power converter to the output of the switch mode power converter;
a first conductor including a first conductive loop coupled to the control circuit, wherein the first conductor is included in a lead frame of an integrated circuit package;
a second conductor included in the lead frame of the integrated circuit package and galvanically isolated from the first conductor, wherein the second conductor includes a second conductive loop disposed proximate to and magnetically coupled to the first conductive loop to provide a communication link between the first and second conductors, wherein the control circuit is coupled to switch the switching circuit in response to one or more control signals received from the second conductive loop through the magnetic coupling between the first and second conductive loops;
an isolated synchronous flyback converter, wherein the control circuit is a primary control circuit, and wherein the switch mode power converter further comprises:
a second switch coupled to an output of the energy transfer element and the output of the switch mode power converter; and
a secondary control circuit coupled to receive a feedback signal representative of the output of the switch mode power converter, wherein the secondary control circuit is further coupled to the second switch to control switching of the second switch to transfer energy from the energy transfer element to the output of the power supply, wherein the secondary control circuit is coupled to the second conductor to transmit the one or more control signals in response to the feedback signal, through the magnetic coupling between the first and second conductive loops to the primary control circuit.

19. A switch mode power converter, comprising:
a switching circuit coupled to an input of an energy transfer element and an input of the switch mode power converter;
the energy transfer element coupled between the switching circuit and an output of the switch mode power converter;
a control circuit coupled to the switching circuit to control switching of the switching circuit to regulate a transfer of energy from the input of the switch mode power converter to the output of the switch mode power converter;
a first conductor including a first conductive loop coupled to the control circuit, wherein the first conductor is included in a lead frame of an integrated circuit package;
a second conductor included in the lead frame of the integrated circuit package and galvanically isolated from the first conductor, wherein the second conductor includes a second conductive loop disposed proximate to and magnetically coupled to the first conductive loop to provide a communication link between the first and second conductors, wherein the control circuit is coupled to switch the switching circuit in response to one or more control signals received from the second conductive loop through the magnetic coupling between the first and second conductive loops; and
an isolated flyback converter, wherein the control circuit is a primary control circuit, and wherein the switch mode power converter further comprises a secondary control circuit coupled to receive a feedback signal representative of the output of the switch mode power converter, wherein the one or more control signals is responsive to the feedback signal, and wherein the secondary control circuit is coupled to the second conductor to transmit the one or more control signals through the magnetic coupling between the first and second conductive loops to the primary control circuit.

20. The switch mode power converter of claim 19 wherein the secondary control circuit is further coupled to receive a zero crossing signal from the primary control circuit through the communication link between the first and second conductors.

21. The switch mode power converter of claim 17 wherein the switch mode power converter comprises a buck converter, wherein the control circuit is a high-side control circuit, and wherein the switch mode power converter further comprises a second control circuit coupled to receive a feedback signal representative of the output of the switch mode power converter, wherein the one or more control signals are responsive to the feedback signal, wherein the second control circuit is coupled to the second conductor to transmit the one or more control signals through the magnetic coupling between the first and second conductive loops to the high-side control circuit.

22. The switch mode power converter of claim 17 wherein the switching circuit comprises a half-bridge converter that includes a switching leg having a high-side switch and a low-side switch coupled to drive the energy transfer element, wherein the control circuit is one of a plurality of control circuits, wherein each one of the plurality of control circuits is coupled to control switching of a respective one of the high-side and low-side switches.

23. The switch mode power converter of claim 22 wherein a status signal is communicated from the control circuit to an other one of the plurality of control circuits through the communication link.

24. The switch mode power converter of claim 17 wherein the switching circuit comprises a full-bridge configuration that includes first and second switching legs, wherein each one of the first and second switching legs comprises a high-side switch and a low-side switch coupled to drive the energy transfer element, wherein the control circuit is one of a plurality of control circuits, wherein each one of the plurality of control circuits is coupled to control switching of a respective one of the high-side and low-side switches.

25. The switch mode power converter of claim 24 wherein a status signal is communicated from the control circuit to a full-bridge controller circuit through the communication link.

26. The switch mode power converter of claim 17 wherein the control circuit is included in a first integrated circuit die mounted on the first conductor of lead frame, wherein the first integrated circuit die couples together portions of the first conductive loop.

27. The switch mode power converter of claim 26 further comprising a first bond wire coupled to the first conductor and the first integrated circuit die, wherein the first bond wire is included as a portion of the first conductive loop.

28. The switch mode power converter of claim 26 further comprising a second integrated circuit die isolated from the first integrated circuit die and mounted on the second conductor of the lead frame, wherein the second integrated circuit die couples together portions of the second conductive loop.

29. The switch mode power converter of claim 28 further comprising a second bond wire coupled to the second conductor and the second integrated circuit die, wherein the second bond wire is included as a portion of the second conductive loop.

30. The switch mode power converter of claim 17 wherein the one or more control signals comprises a coded signal.

31. The switch mode power converter of claim 17 wherein the communication link comprises a unidirectional communication link.

32. The switch mode power converter of claim 17 wherein the communication link comprises a bidirectional communication link.

* * * * *